(12) United States Patent
Kwak

(10) Patent No.: US 8,934,302 B2
(45) Date of Patent: Jan. 13, 2015

(54) NONVOLATILE MEMORY HAVING STACKED STRUCTURE AND RELATED METHOD OF OPERATION

(75) Inventor: Dong-Hun Kwak, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 214 days.

(21) Appl. No.: 13/600,327

(22) Filed: Aug. 31, 2012

(65) Prior Publication Data

US 2013/0107653 A1     May 2, 2013

(30) Foreign Application Priority Data

Oct. 31, 2011    (KR) .................. 10-2011-0112401

(51) Int. Cl.
*G11C 16/04* (2006.01)
*G11C 7/00* (2006.01)
*H01L 27/115* (2006.01)

(52) U.S. Cl.
CPC .............. *G11C 7/00* (2013.01); *H01L 27/1157* (2013.01); *H01L 27/11582* (2013.01)
USPC ............ 365/185.19; 365/185.05; 365/189.09; 365/236

(58) Field of Classification Search
CPC ...................... G11C 16/3481; G11C 29/12005; G11C 16/10

USPC ................... 365/185.19, 185.05, 189.09, 236
See application file for complete search history.

(56) References Cited

U.S. PATENT DOCUMENTS

| 7,616,495 | B2 | 11/2009 | Mokhlesi |
| 7,688,632 | B2 | 3/2010 | Nagashima et al. |
| 8,570,802 | B2 * | 10/2013 | Shirakawa ............... 365/185.03 |
| 8,605,504 | B2 * | 12/2013 | Okamoto ................. 365/185.09 |
| 2005/0018483 | A1 * | 1/2005 | Imamiya et al. ......... 365/185.09 |
| 2013/0235667 | A1 * | 9/2013 | Nam et al. ............... 365/185.17 |

FOREIGN PATENT DOCUMENTS

| KR | 10-0953045 | 4/2010 |
| KR | 10-0953791 | 4/2010 |
| KR | 1020110062543 A | 6/2011 |

* cited by examiner

*Primary Examiner* — Tuan T Nguyen
(74) *Attorney, Agent, or Firm* — Volentine & Whitt, PLLC

(57) ABSTRACT

A method is provided for operating a nonvolatile memory comprising memory cells stacked on a substrate. The method comprises counting a number of program loops performed in a first program operation of selected memory cells connected to a selected wordline, and controlling an increment of a program voltage between successive program loops of a second program operation of the selected memory cells according to the counted number.

20 Claims, 22 Drawing Sheets

Fig. 2
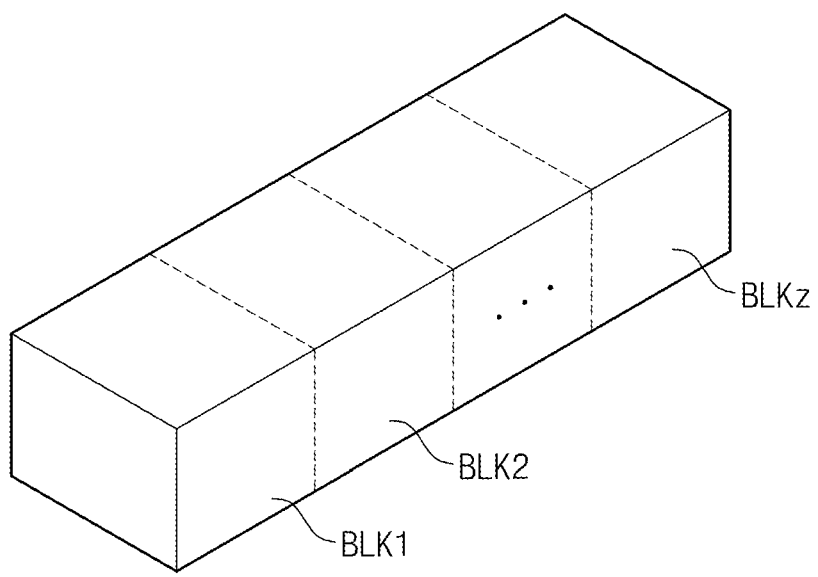
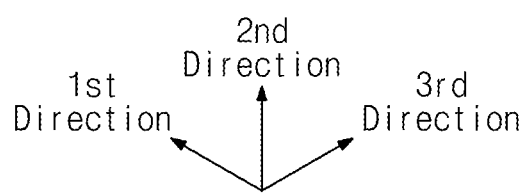

Fig. 7
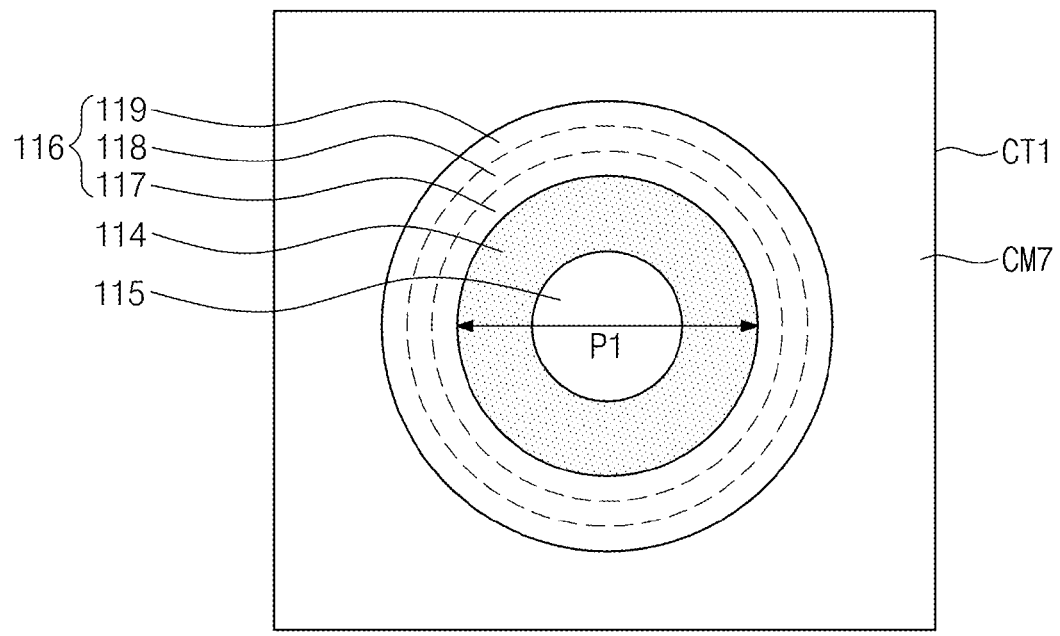
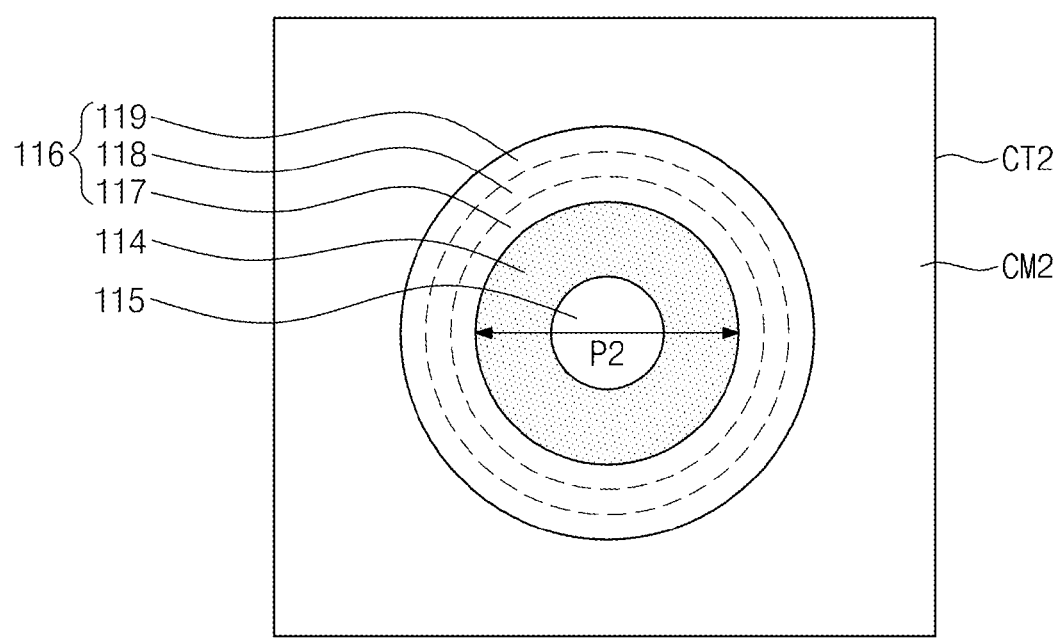

NONVOLATILE MEMORY HAVING STACKED STRUCTURE AND RELATED METHOD OF OPERATION

CROSS-REFERENCE TO RELATED APPLICATIONS

This application claims priority under 35 U.S.C. §119 to Korean Patent Application No. 10-2011-0112401 filed on Oct. 31, 2011, the subject matter of which is hereby incorporated by reference.

BACKGROUND OF THE INVENTION

The inventive concept relates generally to semiconductor memories. More particularly, the inventive concept relates to nonvolatile memories having a three-dimensional (3D) structure.

Semiconductor memories are a common feature of most modern electronic devices. They are used for a wide variety of purposes, such as providing long-term data storage, short-term data storage, buffering for ongoing operations, and so on. Different types of semiconductor memories may be used for different purposes based on performance tradeoffs, cost, or other factors. For example, semiconductor memories having faster access times may be used to store more frequently accessed data, while semiconductor memories having greater storage capacity may be used to provide long-term data storage for large amounts of data.

One attribute that can be used to categorize different types of semiconductor memories is whether they are able to retain stored data in the absence of applied power. For example, nonvolatile memory devices retain stored data when disconnected from power while volatile memories lose stored data when disconnected from power. In recent years, there has been a continuing increase in the demand for nonvolatile memory devices based on trends such as the proliferation of mobile devices and an increasing demand for personal data storage. In an effort to meet this ever increasing demand, researchers have continually sought ways to develop nonvolatile memory devices with increased storage capacity and performance.

One approach to increasing the storage capacity and performance of nonvolatile memory devices is to form memory cells in a 3D structure. This is typically accomplished by forming arrays of cells on top of each other in a stacked configuration. The design and implementation of nonvolatile memory devices with a 3D structure raises many technical challenges that can affect performance, reliability, durability, and so on. Accordingly, there is a general need for new techniques and technologies to improve these and other aspects of nonvolatile memory devices having a 3D structure.

SUMMARY OF THE INVENTION

In one embodiment of the inventive concept, a method is provided for operating a nonvolatile memory comprising memory cells stacked on a substrate. The method comprises counting a number of program loops performed in a first program operation of selected memory cells connected to a selected wordline, and controlling an increment of a program voltage between successive program loops of a second program operation of the selected memory cells according to the counted number.

In another embodiment of the inventive concept, a nonvolatile memory comprises a memory cell array comprising a plurality of memory cells stacked on a substrate, wherein the memory cell array is connected to a plurality of wordlines, a voltage generator configured to generate a program voltage with an incremented value in successive program loops of program operations, an address decoder configured to apply the generated program voltage to a selected wordline among the plurality of wordlines to program selected memory cells, and control logic comprising a loop counter configured to count the number of program loops in a first program operation of the selected memory cells, and configured to control the increment between successive program loops of a second program operation performed on the selected memory cells according to the counted number of program loops.

In another embodiment of the inventive concept, a method is provided for operating a nonvolatile memory device comprising memory cells having a stacked configuration. The method comprises performing a first program operation on selected memory cells connected to a selected wordline by performing incremental step pulse programming with a plurality of program loops, and performing a second program operation on the selected memory cells by performing incremental step pulse programming with a plurality of program loops and using an increment between successive program loops based on a number of program loops performed in the first program operation.

BRIEF DESCRIPTION OF THE DRAWINGS

The drawings illustrate selected embodiments of the inventive concept. In the drawings, like reference numbers indicate like features.

FIG. 2 is a block diagram illustrating a memory cell array of FIG. 1.

FIG. 7 shows cross-sectional views of first and second transistors of FIG. 4 taken along first and third directions.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. Terms such as "comprises", "comprising," "includes" "including", etc., where used in this specification, indicate the presence of stated features but do not preclude the presence other features.

Figure 1:
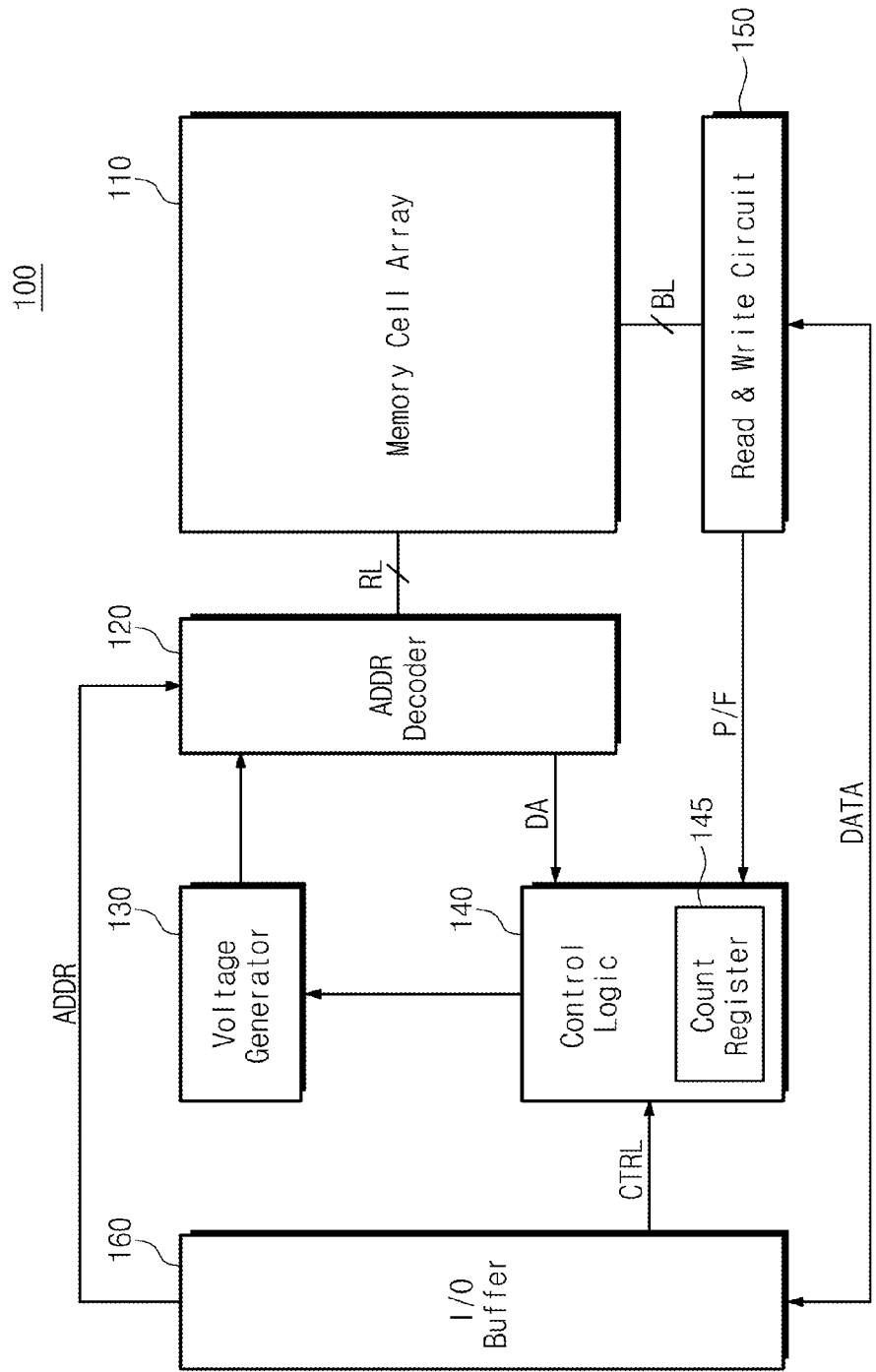
FIG. 1 is a block diagram illustrating a nonvolatile memory in accordance with an embodiment of the inventive concept.

FIG. 1 is a block diagram illustrating a nonvolatile memory 100 in accordance with an embodiment of the inventive concept.

Referring to FIG. 1, nonvolatile memory 100 comprises a memory cell array 110, an address decoder 120, a voltage generator 130, control logic 140, a read & write circuit 150 and an input/output buffer 160.

Memory cell array 110 is coupled to address decoder 120 through row lines RL. Row lines RL comprise string select lines, ground select lines and a plurality of wordlines. Memory cell array 110 is coupled to read & write circuit 150 through bitlines BL. Memory cell array 110 comprises a plurality of memory cells stacked on a substrate. The memory cells each store one or more bits per cell.

Address decoder 120 is coupled to memory cell array 110, voltage generator 130, and input/output buffer 160. Address decoder 120 operates under the control of control logic 140. Address decoder 120 receives addresses ADDR from input/output buffer 160.

Address decoder 120 is configured to decode a block address among the received addresses ADDR. Address decoder 120 selects one of memory blocks included in memory cell array 110 on the basis of the decoded block address.

Address decoder 120 decodes a row address among addresses ADDR. Address decoder 120 applies a voltage to each of row lines RL according to the decoded row address DA, and it transmits the decoded row address DA to control logic 140.

Where a program operation is performed, address decoder 120 receives a program voltage and a pass voltage from voltage generator 130. Address decoder 120 applies the program voltage to the selected wordline (i.e., a wordline corresponding to the address) among row lines RL. Address decoder 120 applies the pass voltage to each of the unselected wordlines (i.e., wordline not corresponding to the address) among row lines RL. Address decoder 120 applies a supply voltage to the selected string select line and floats the ground select line of the selected memory block.

Where a read operation and a verification operation are performed, address decoder 120 applies a select read voltage generated from voltage generator 130 to the selected wordline. Address decoder 120 applies an unselect read voltage generated from voltage generator 130 to unselected wordlines.

Address decoder 120 typically comprises a row decoder that decodes a row address, and an address buffer storing an address ADDR.

Voltage generator 130 is coupled to control logic 140 and address decoder 120, and it operates under the control of control logic 140. Voltage generator 130 is configured to generate high voltages. For example, voltage generator 130 may comprise a plurality of pumping capacitors, and it may generate various high voltages using the pumping capacitors. In a program operation, voltage generator 130 generates a program voltage and a pass voltage. The program voltage and the pass voltage are transferred to a plurality of wordlines among row lines RL through address decoder 120.

Where dummy memory cells connected to a dummy wordline are included in memory cell array 110, voltage generator 130 further generates a dummy wordline voltage. The dummy wordline voltage is applied to the dummy wordline through address decoder 120.

One program operation comprises a plurality of program loops, and each program loop comprises a subprogram operation that applies the program voltage to the selected wordline and a verifying read operation that verifies whether each of the programmed memory cells has a target threshold voltage. Voltage generator 130 generates a program voltage in each program loop. The program voltage increases between successive program loops. In other words, voltage generator 130 generates the program voltage with a magnitude that increases in stages within a program operation.

The program voltages being increased in stages are applied to the selected wordline through address decoder 120. A program operation is performed by apply a plurality of program voltages to the selected wordline when one program operation is performed. At this time, the increment between the program voltages is controlled by control logic 140.

Control logic 140 is coupled to address decoder 120, voltage generator 130, read & write circuit 150 and input/output buffer 160. Control logic 140 receives a control signal CTRL from input/output buffer 160. Control logic 140 controls operations of nonvolatile memory 100 in response to control signal CTRL. Where control signal CTRL indicating a program operation is received, control logic 140 controls nonvolatile memory 100 to perform a program operation.

Control logic 140 typically comprises a count register 145. Control logic 140 counts a number of times that program voltages are applied to the selected wordline when a program operation is performed and stores the counted number in count register 145. The applied number of times is stored for the selected wordline. Control logic 140 stores the applied number of times corresponding to each wordline in a table.

The number of times that the program voltages are applied to the selected wordline may be counted according to a pass/fail signal P/F received from read & write circuit 150. The pass/fail signal P/F is received at every program loop of the program operation. If the pass/fail signal P/F indicates a program fail, control logic 140 increase the applied number of times by 1. If the pass/fail signal P/F indicates a program pass, control logic 140 stores the counted applied number of times in count register 145.

The applied number of times stored in count register 145 may be stored in memory cell array 110. For example, memory cell array 110 typically includes a user area in which data to be programmed is stored and a spare area in which metadata is stored. Control logic 140 stores the applied number of times stored in count register 145 in memory cell array 110.

Control logic 140 determines whether to control the increment between program voltages depending on whether the applied number of times corresponding to the selected wordline when a program operation is performed is stored in count register 145 or not. If the applied number of times is stored in memory cell array 110, control logic 140 loads the applied number of times from memory cell array 110 to count register 145.

Where the applied number of times corresponding to the selected wordline is stored in count register 145, control logic 140 controls the increment between the program voltages according to the applied number of times. Control logic 140 receives decoded row address DA from address decoder 120 when a program operation is performed. Control logic 140 recognizes the wordline selected according to decoded row address DA and judges whether the applied number of times corresponding to the selected wordline is stored in the count register or not. Control logic 140 directly receives an address ADDR from input/output buffer 160 and may recognize the wordline selected according to address ADDR.

Read & write circuit 150 is coupled to the memory cell array through bitlines BL. Read & write circuit 150 operates under the control of control logic 140. Read & write circuit 150 exchanges data DATA with input/output buffer 160. In a program operation, read & write circuit 150 receives data DATA to be programmed from input/output buffer 160. Read & write circuit 150 programs data DATA in memory cells connected to the selected wordline. A program voltage (e.g., a ground voltage) or a program inhibit voltage (e.g., a power supply voltage) is applied to bitlines BL according to the value of data DATA to be programmed.

In a verifying read operation, read & write circuit 150 reads data stored in the memory cells of the selected wordline and compares the read data with data DATA to be programmed. If the data stored in the memory cells is different from data DATA to be programmed, read & write circuit 150 generates pass/fail signal (P/F) indicating a program fail. If data stored in the memory cells of the selected wordline is the same as data DATA, read & write circuit 150 generates pass/fail signal (P/F) indicating a successful program operation (i.e., a "program pass").

Read & write circuit 150 typically comprises constituent elements such as a page buffer (or a page register) and a column select circuit, etc. Read & write circuit 150 may further comprise other features such as a sense amplifier, a write driver, a column select circuit, etc.

Input/output buffer 160 is coupled to address decoder 120, control logic 140 and read & write circuit 150. Input/output buffer 160 receives a control signal CTRL and an address ADDR from an external source and transmits control signal CTRL and address ADDR to control logic 140 and address decoder 120 respectively.

Input/output buffer 160 exchanges data DATA with the outside, i.e., with devices external to nonvolatile memory 100. In a program operation, input/output buffer 160 transmits data DATA received from the outside to read & write circuit 150. In a read operation, input/output buffer 160 transmits data DATA received from read & write circuit 150 to the outside.

FIG. 2 is a block diagram illustrating an example of memory cell array 110 of FIG. 1.

Referring to FIG. 2, memory cell array 110 comprises a plurality of memory blocks BLK1~BLKz. Each memory block has a three-dimensional structure (or vertical structure). For example, each memory block comprises structures extending in first, second and third directions. Each memory block comprises a plurality of cell strings extending in second direction. A plurality of cell strings disposed along the first and third directions is provided. Each memory block is connected to a plurality of bitlines BL, a plurality of string select lines SSL, a ground select line GSL, a plurality of wordlines WL and a common source line CSL.

Figure 3:
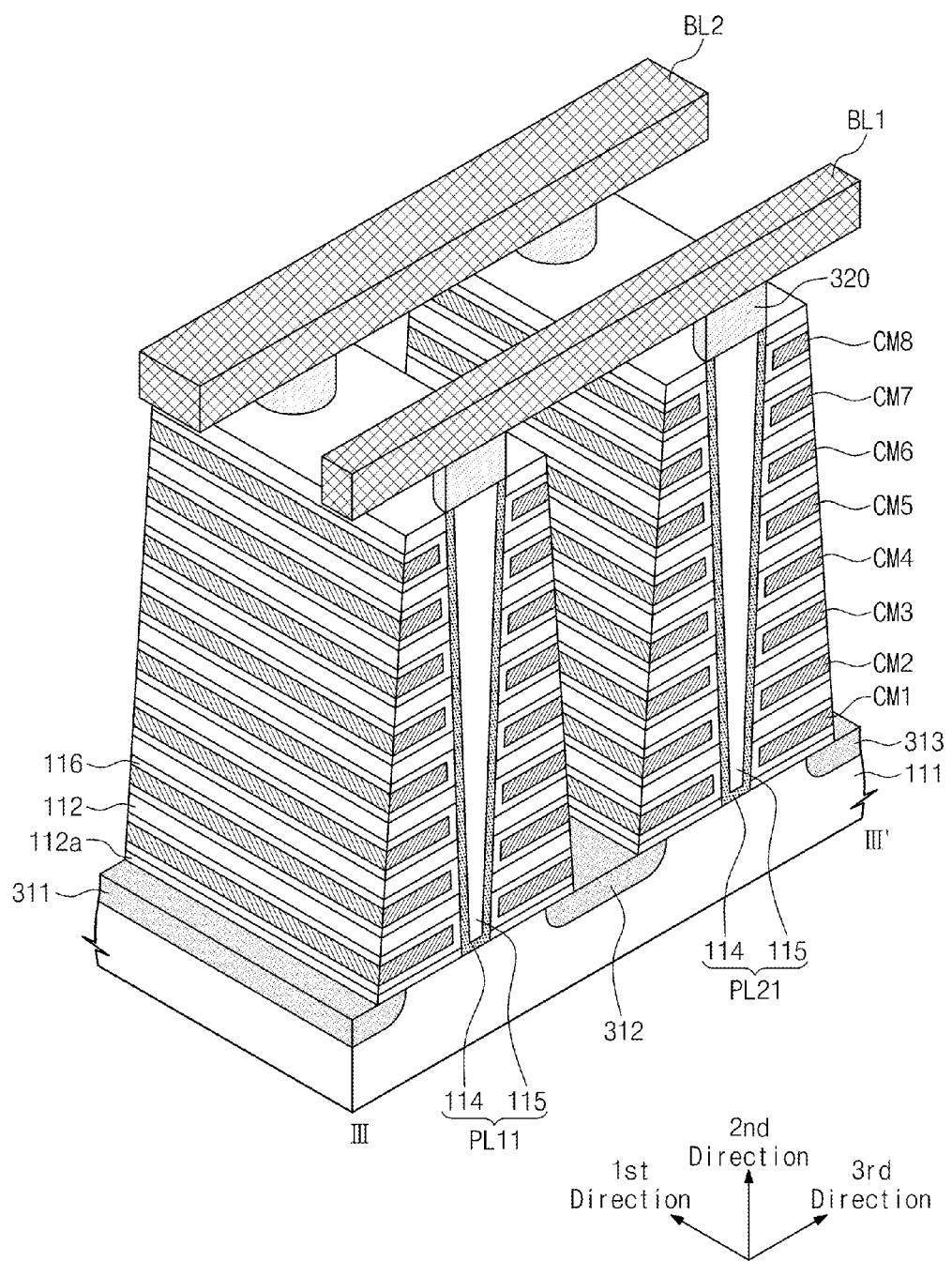
FIG. 3 is a perspective view of one of the memory blocks illustrated in FIG. 2.
Figure 4:
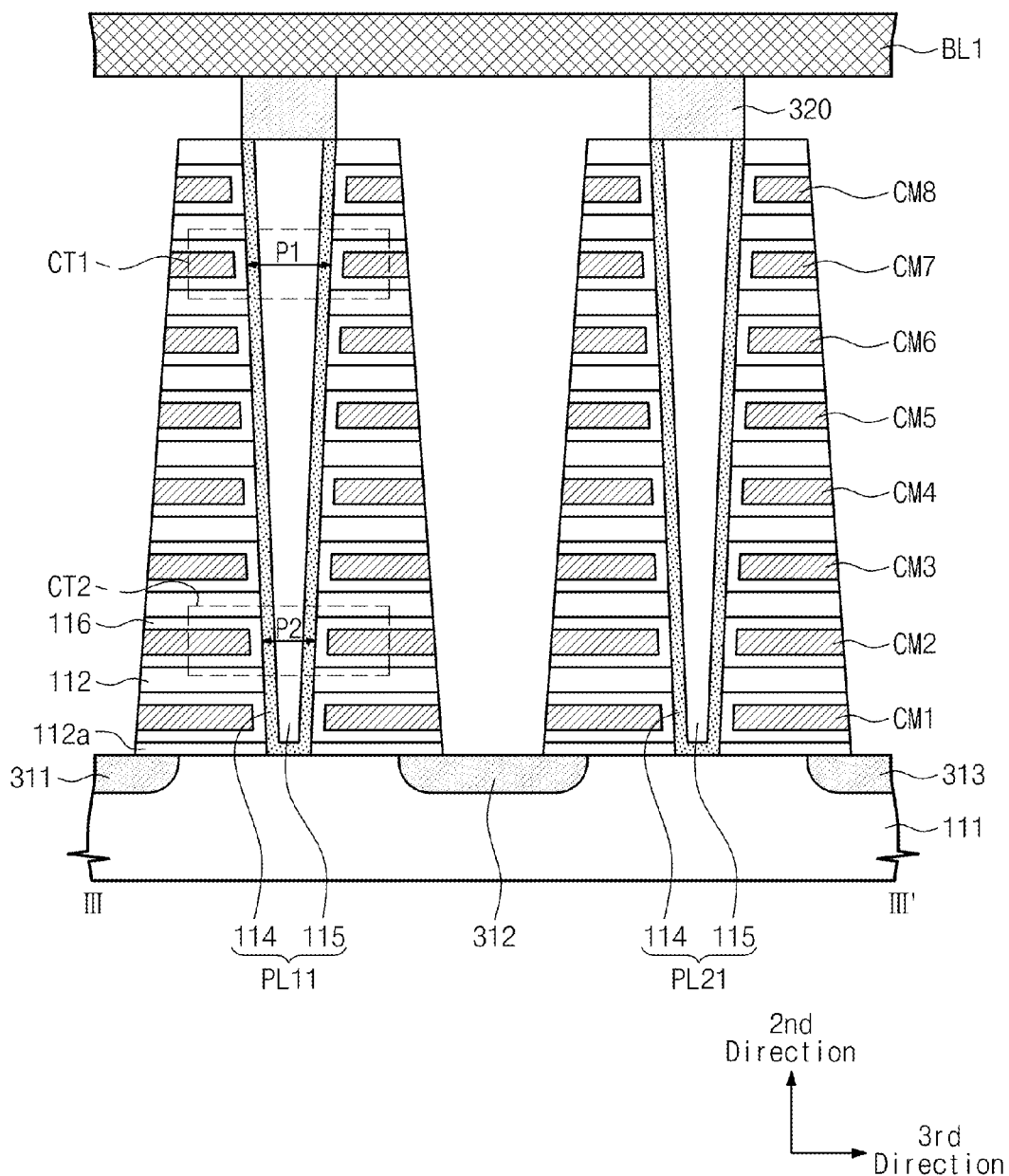
FIG. 4 is a cross-sectional view of the memory block illustrated in FIG. 3.

FIG. 3 is a perspective view of one of memory blocks BLK1~BLKz illustrated in FIG. 2. FIG. 4 is a cross-sectional view of one of memory blocks BLK1~BLKz illustrated in FIG. 2.

Referring to FIGS. 3 and 4, the memory block comprises a substrate 111. Substrate 111 may be a well having a first conductivity type. For example, it may be a P-well into which a three-group element such as boron B is injected. Substrate 111 may be a pocket P-well provided inside an N-well. For explanation purposes, it will be assumed that substrate 111 is P-well (or a pocket P-well). However, substrate 111 is not limited to the described example.

A plurality of doping areas 311~313 extend in a first direction. Doping areas 311~313 are spaced a specific distance apart along the third direction. Doping areas 311~313 illustrated in FIGS. 3 and 4 are sequentially defined as a first doping area 311, a second doping area 312 and a third doping area 313.

First, second and third doping areas 311~313 have a second conductivity type different from substrate 111. Hereinafter, it is assumed that first, second and third doping areas 311~313 have N-type conductivity. However, first, second and third doping areas 311~313 are not limited to N-type conductivity.

Between two adjacent doping areas among the first, second and third doping areas 311~313, a plurality of insulating materials 112 and 112a is sequentially provided on substrate 111 along the second direction (i.e., a direction perpendicular to substrate 111). Insulating materials 112 and 112a are spaced apart by a predetermined distance along the second direction. Insulating materials 112 and 112a comprise an insulating material such as a silicon oxide layer. A thickness of insulating material 112a in contact with substrate 111 may be smaller than thicknesses of other insulating materials.

Between adjacent two doping areas among first, second and third doping areas 311~313, a plurality of pillars PL11, PL12, PL21 and PL22 is provided. These pillars are disposed along the first direction and penetrate insulating materials 112 and 112a along the second direction. Pillars PL11, PL12, PL21 and PL22 penetrate insulating materials 112 to contact substrate 111. Thicknesses of pillars PL11, PL12, PL21 and PL22 become small as they approach substrate 111.

Each of pillars PL11, PL12, PL21 and PL22 comprises a multi-layer. Channel films 114 comprise a semiconductor material (e.g., silicon) having the same conductivity type as substrate 111. Hereinafter, it is assumed that channel films 114 include P-type silicon. However, channel films 114 are not limited to P-type silicon. For example, channel films 114 may include an intrinsic semiconductor.

Internal materials 115 comprise an insulating material. Internal materials 115 comprise an insulating material such as silicon oxide. Internal materials 115 comprise an air gap.

Between adjacent two doping areas among first, second and third doping areas 311~313, information storage layers 116 are provided on insulating materials 112 and exposed surfaces of pillars PL11, PL12, PL21 and PL22. In FIG. 4, a thickness of information storage layer 116 is smaller than a distance between insulating materials 112.

Between adjacent doping areas among first, second and third doping areas 311~313, conductive materials CM1~CM8 are provided between information storage layers 116. Conductive materials CM1~CM8 comprise a metallic conductive material. Conductive materials CM1~CM8 comprise a nonmetallic conductive material such as polysilicon.

A plurality of drains 320 is provided on pillars PL11, PL12, PL21 and PL22. Drains 320 comprise a semiconductor material (e.g., silicon) having a second conductivity type. Drains 320 comprise a semiconductor material (e.g., silicon) having an N conductivity type. Hereinafter, it is assumed that drains 320 include N-type silicon. However, drains 320 are not limited to N-type silicon.

Bitlines BL1 and BL2 extending in the third direction and being spaced a specific distance apart along the first direction are provided on drains 320. bitlines BL1 and BL2 are connected to drains 320. Drains 320 and bitlines BL1 and BL2 are connected to each other through contact plugs (not illustrated). Bitlines BL1 and BL2 typically comprise a metallic conductive material. Alternatively, bitlines BL1 and BL2 may comprise a nonmetallic conductive material such as polysilicon.

Pillars PL11 and PL12 are defined as first row pillars, and they comprise a combination of conductive materials CM1~CM8 and information storage layers 116 provided between first doping area 311 and second doping area 312. Pillars PL21 and PL22 are defined as second row pillars, and they comprise conductive materials CM1~CM8 and information storage layers 116 provided between second doping area 312 and third doping area 313. That is, the row direction means the first direction. Columns of pillars PL11, PL12 and PL21 are defined according to bitlines BL1 and BL2. Pillars PL11 and PL21 are defined as first column pillars and are connected to each other through first bitline BL1 and drain 320. Pillars PL12 and PL22 are defined as second column pillars and are connected to each other through second bitline BL2 and drain 320. That is, the column direction is the third direction.

Conductive materials CM1~CM8 are defined to have first through eighth heights according to their respective distances from substrate 111. For example, first conductive material CM1 adjacent to substrate 111 has a first height, and eighth conductive material CM8 adjacent to bitlines BL1 and BL2 has an eighth height.

Each of pillars PL11, PL12, PL21 and PL22 constitutes one cell string together with adjacent information storage layers 116 and adjacent conductive materials CM1~CM8. That is, pillars PL11, PL12, PL21 and PL22 form a plurality of cell strings together with information storage layers 116 and conductive materials CM1~CM8. Each of the cell strings comprises a plurality of cell transistors stacked on substrate 111.

Figure 5:
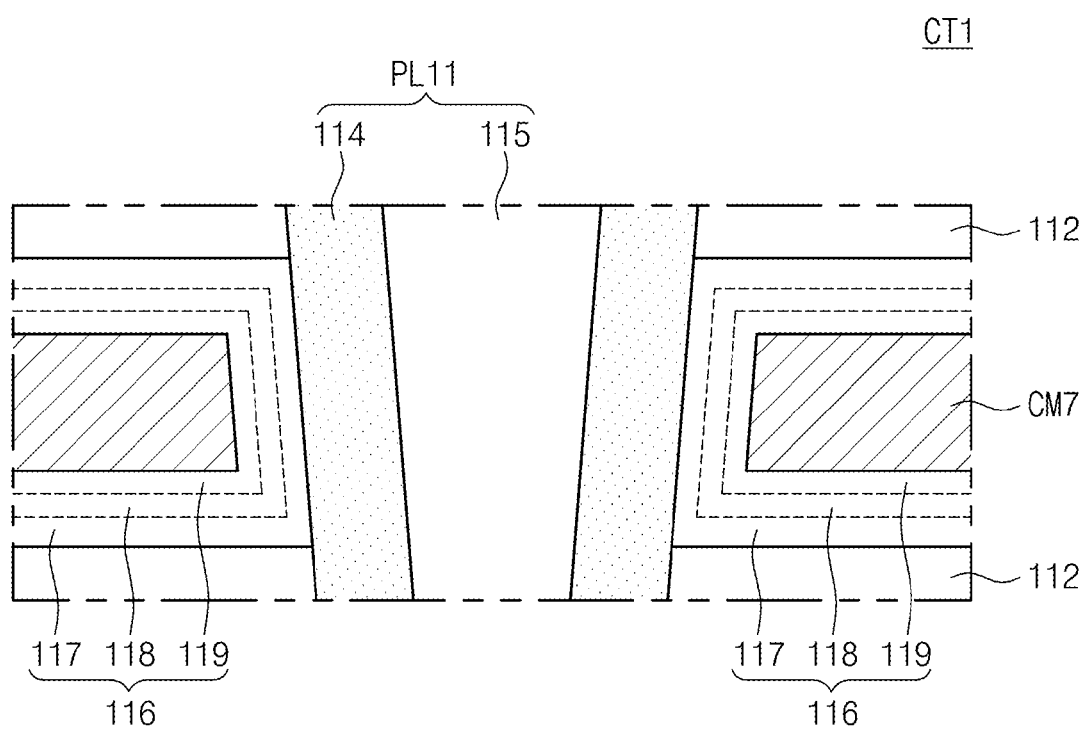
FIG. 5 is an enlarged view of a cell transistor illustrated in FIG. 4.

FIG. 5 is an enlarged view of cell transistor CT1 illustrated in FIG. 4. As an illustration, first cell transistor CT1 is illustrated which has the seventh height among the cell transistors corresponding to pillar PL11.

Referring to FIGS. 4 and 5, first cell transistor CT1 comprises seventh conductive material CM7, a part of pillar PL11 adjacent to seventh conductive material CM7 and an information storage layer disposed between seventh conductive material CM7 and pillar PL11.

Information storage layer 116 extends from between seventh conductive material CM7 and pillar PL11 to top and bottom surfaces of seventh conductive material CM7. Information storage layer 116 comprises first, second and third sub insulating layers 117, 118 and 119.

Channel film 114 comprises P-type silicon which is the same with substrate 111. Channel film 114 operates as a body of the cell transistors. Channel film 114 is formed in a direction perpendicular to substrate 111. The channel film operates as a vertical body. A channel formed in channel film 114 is a vertical channel. Seventh conductive material CM7 operates as a gate (or a control gate).

First sub insulating layer 117 adjacent to pillar PL11 operates as a tunneling insulating layer. First sub insulating layer 117 adjacent to pillar PL11 comprises a thermal oxide layer. First sub insulating layer 117 comprises a silicon oxide layer.

Second sub insulating layer 118 operates as a charge storage layer. Second sub insulating layer 118 operates as a charge capturing layer. Second sub insulating layer 118 comprises a nitride layer or a metallic oxide layer (e.g., an aluminum oxide layer, a hafnium oxide layer, etc.). Second sub insulating layer 118 comprises a silicon nitride layer.

Third sub insulating layer 119 adjacent to seventh conductive material CM7 operates as a blocking insulating layer. Third sub insulating layer 119 may be formed as a single layer or a multilayer. Third sub insulating layer 119 may be a high dielectric layer (e.g., an aluminum oxide layer, a hafnium oxide layer, etc.) having a dielectric constant higher than the first and second sub insulating layers 117 and 118. Third sub insulating layer 119 may include a silicon oxide layer. Collectively, first, second and third sub insulating layers 117, 118 and 119 may constitute an ONO (oxide-nitride-oxide).

Seventh conductive material CM7 operating as a gate (or a control gate), third sub insulating layer 119 operating as a blocking insulating layer, second sub insulating layer 118 operating as a charge storage layer, first sub insulating layer 117 operating as a tunneling insulating layer and channel film 114 operating as a vertical body operate as a cell transistor. The cell transistor is a charge capturing cell transistor.

The cell transistors may be used for different purposes depending on their heights. For example, at least one cell transistor provided at an upper portion among the cell transistors may be used as a string select transistor SST. At least one cell transistor provided at a lower portion among the cell transistors may be used as a ground select transistor GST. The remaining cell transistors may be used as memory cells.

It is assumed that first cell transistor CT1 is used as a memory cell. Where a program operation is performed, a high voltage is applied to seventh conductive material CM7 and a channel of low voltage (e.g., power supply voltage) is formed in channel film 114. Charges in the channel may be captured by second sub insulating layer 118. However, a part of the charges in the channel may be released to seventh conductive material CM7 through third sub insulating layer 119. For example, a back tunneling phenomenon may occur. The back tunneling phenomenon may be determined by a ratio of voltages applied to first, second and third sub insulating layers 117, 118 and 119 respectively.

Referring again to FIG. 4, conductive materials CM1~CM8 extend in a row direction (i.e., the first direction) and combine with pillars PL11, PL12 or PL21, PL22. That is, conductive materials CM1~CM8 constitute conductive lines connecting cell transistors of the same row pillars PL11, PL12 or PL21, PL22 to each other.

Conductive materials CM1~CM8 may be used as a string select line SSL, a ground select line GSL or a wordline WL depending on their heights.

Figure 6:
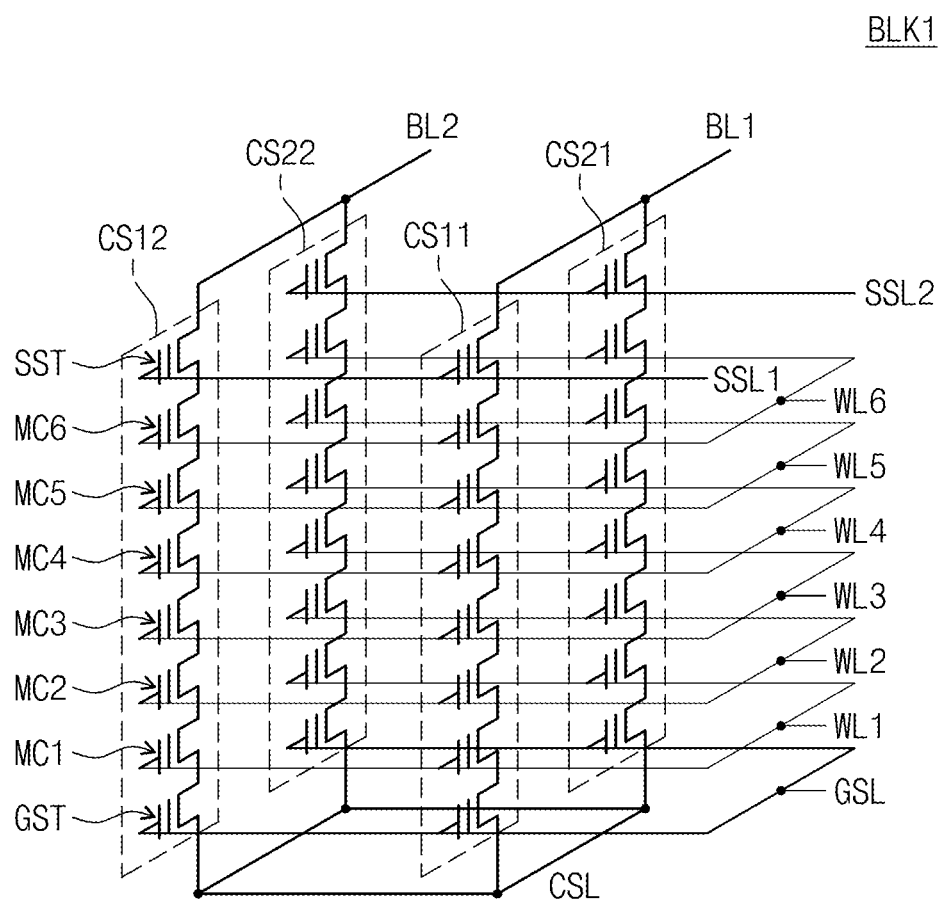
FIG. 6 is a circuit diagram illustrating an equivalent circuit of the memory block of FIG. 3.

FIG. 6 is a circuit diagram illustrating an equivalent circuit of the memory block of FIG. 3.

Referring to FIGS. 3 through 6, cell strings CS11 and CS21 are located between first bitline BL1 and common source line CSL. Cell strings CS12 and CS22 are located between second bitline BL2 and common source line CSL. Cell strings CS11, CS21, CS12 and CS22 correspond to pillars PL11, PL21, PL12 and PL22 respectively.

Pillar PL11 of first row and first column constitutes cell string CS11 of first row and first column together with conductive materials CM1~CM8 and information storage layers 116. Pillar PL12 of first row and second column constitutes cell string CS12 of first row and second column together with conductive materials CM1~CM8 and information storage layers 116. Pillar PL21 of second row and first column constitutes cell string CS21 of second row and first column together with conductive materials CM1~CM8 and information storage layers 116. Pillar PL22 of second row and second column constitutes cell string CS22 of second row and second column together with conductive materials CM1~CM8 and information storage layers 116.

Cell transistors having a first height in cell strings CS11, CS21, CS12 and CS22 operate as ground select transistors GST. As an illustration, first conductive materials CM1 are connected to one another to form ground select line GSL. Cell transistors having an eighth height in cell strings CS11, CS21, CS12 and CS22 operate as string select transistors SST. String select transistors SST are connected to the first and second string select lines SSL1 and SSL2.

Cell strings of the same row share the same string select line. Cell strings of different row are connected to different string select lines. First conductive materials CM1 are connected to one another to form ground select line GSL. Second conductive materials CM2 are connected to one another to form a first wordline WL1. Third conductive materials CM3 are connected to one another to form a second wordline WL2. Fourth conductive materials CM4 are connected to one another to form a third wordline WL3. Fifth conductive materials CM5 are connected to one another to form a fourth wordline WL4. Sixth conductive materials CM6 are connected to one another to form a fifth wordline WL5. Seventh conductive materials CM7 are connected to one another to form a sixth wordline WL6. First and second string select lines SSL1 and SSL2 correspond to eighth conductive materials CM8.

Common source line CSL is connected to cell strings CS 11, CS 12, CS21 and CS22 in common. First, second and third doping areas 311~313 are connected to one another to form common source line CSL.

Memory cells having the same height are connected to one wordline in common. Thus, where a wordline of specific height is selected, all cell strings CS11, CS12, CS21 and CS22 are selected which are connected to the selected wordline.

Cell strings of different rows are connected to different select lines. Thus, by selecting and unselecting first and second string select lines SSL1 and SSL2, for example, the cell strings (CS11 and CS12, or CS21 and CS22) of the unselected row among cell strings CS11, CS12, CS21 and CS22 connected to the same wordline are electrically separated from bitlines BL1 and BL2. The cell strings (CS21 and CS22 or CS11 and CS12) of the selected row are electrically connected to bitlines BL1 and BL2. Accordingly, by selecting and unselecting first and second string select lines SSL1 and SSL2, rows of cell strings CS11, CS12, CS21 and CS22 may be selected. By selecting bitlines BL1 and BL2, columns of the cell strings of the selected row may be selected.

A program operation and a read operation are performed by page unit. Accordingly, memory cells connected to the same wordline among cell strings connected to the same string select line are programmed and read at the same time. Where a program operation and a read operation are performed, an address ADDR being received from the outside corresponds to a specific page.

A width (a cross-sectional area taken along the first and third directions) of each of pillars PL11, PL12, PL21 and PL22 is reduced as it approaches substrate 111. Due to properties, variances, or errors in a process, a width of pillar corresponding to each height of memory block BLK1 may vary.

In FIGS. 3 through 6, for explanation purposes, memory block BLK1 is described as having cell strings in a second row and second column. However, a shape of memory block BLK1 may be changed. A height of memory block BLK1 may be the same as the number of cell strings disposed in a column direction. For example, where memory block BLK1 has first through eighth heights, memory block BLK1 may include cell strings disposed over first through eighth columns. Eight string select lines and one ground select line are connected to memory block BLK1.

Each of pillars PL11, PL12, PL21 and PL22 is formed by providing silicon material and insulating material to a hole formed by an etching process. As a depth of the hole increases, a width of the hole decreases. That is, a width of each of pillars PL11, PL12, PL21 and PL22 is reduced as it approaches substrate 111. Referring to FIG. 4, a width P1 of pillar PL11 having the seventh height is greater than a width P2 of pillar PL11 having the second height.

FIG. 7 shows cross-sectional views of first and second transistors (CT1, CT2) of FIG. 4 taken along first and third directions. In the following description with reference to FIGS. 4, 6 and 7, it is assumed that cell string CS12 is selected. A power supply voltage is applied to the first string select line SSL1 and a ground voltage is applied to second bitline BL2. In a program operation, pass voltages are applied to unselected wordlines and a program voltage is applied to the selected wordline. A channel is formed in channel film 114 of pillar PL11 corresponding to cell string CS12. The ground voltage received from second bitline BL2 is applied to channel film 114 of pillar PL11.

Where first cell transistor CT1 is programmed, a sixth wordline WL6 connected to first cell transistor CT1 is a selected wordline. A program voltage is applied to seventh conductive material CM7, producing a voltage difference between channel film 114 of first cell transistor CT1 and seventh conductive material CM7.

Where second cell transistor CT2 is programmed, a first wordline WL1 connected to second cell transistor CT2 is a selected wordline. A program voltage is applied to second conductive material CM2. A voltage difference between channel film 114 of second cell transistor CT2 and second conductive material CM2 may occur.

Where first and second transistors CT1 and CT2 are programmed, charges are released to the second and seventh conductive materials CM2 and CM7. This back tunneling phenomenon is determined by a ratio of voltages applied to each of first through third sub insulating layers 117~119.

A width P1 of pillar corresponding to first cell transistor CT1 is greater than a width P2 of pillar corresponding to second cell transistor CT2. A ratio of voltages applied to first, second and third sub insulating layers 117, 118 and 119 of information storage layer 116 corresponding to first cell transistor CT1 is different from a ratio of voltages applied to the first, second and third sub insulating layers 117, 118 and 119 of information storage layer 116 corresponding to second cell transistor CT2. Thus, the amount of charge released to seventh conductive materials CM7 where first cell transistor CT1 is programmed is different from the amount of charge released to second conductive materials CM2 when second cell transistor CT2 is programmed.

A ratio of voltages applied to first, second and third sub insulating layers 117, 118 and 119 is determined by capacitances of first, second and third sub insulating layers 117, 118 and 119 operating together with serially connected capacitors. A voltage applied to each of first, second and third sub insulating layers 117, 118 and 119 is inversely proportional to a capacitance of each of first, second and third sub insulating layers 117, 118 and 119. The capacitances of the first, second and third sub insulating layers 117, 118 and 119 are proportion to areas of the first, second and third sub insulating layers 117, 118 and 119 respectively. Thus, a voltage applied to each of the first, second and third sub insulating layers 117, 118 and 119 is inversely proportional to an area of each of the first, second and third sub insulating layers 117, 118 and 119.

A width P1 of a pillar corresponding to first cell transistor CT1 is greater than a width P2 of a pillar corresponding to second cell transistor CT2. In other words, a radius of channel film 114 of first cell transistor CT1 is greater than a radius of channel film 114 of second cell transistor CT2. That a radius of the channel film is great means a ratio of a cross-sectional area of third sub insulating layer 119 to cross-sectional areas of the first, second and third sub insulating layers 117, 118 and 119. Thus, a ratio of a cross-sectional area of third sub insulating layer 119 in first cell transistor CT1 is smaller than a ratio of a cross-sectional area of third sub insulating layer 119 in second cell transistor CT2. Consequently, a voltage applied to third sub insulating layer 119 of first cell transistor CT1 is greater than a voltage applied to third sub insulating layer 119 of second cell transistor CT2. Thus, the amount of charge released through third sub insulating layer 119 when first cell transistor CT1 is programmed is larger than the amount of charge released through third sub insulating layer 119 when second cell transistor CT2 is programmed.

In a program operation, a program voltage is increased in stages, i.e., in successive program loops. Where first cell transistor CT1 is programmed, as a higher program voltage is applied, the amount of charge captured by channel film 114 of first cell transistor CT1 increases. Where each program voltage is applied, a threshold voltage of first cell transistor CT1 rises by an amount proportional to the increment of each program voltage. A relation between a threshold voltage of first cell transistor CT1 and the increment of the program voltage is represented by a the following equation (1).

$$\Delta Vth1 = a \times \Delta V$$

In equation (1), ΔVth represents an change of a threshold voltage of first cell transistor CT1, ΔV represents an increment of the program voltage, and "a" is a proportional constant. The proportional constant "a" is inversely proportional to the amount of charge released through third sub insulating layer 119 where first cell transistor CT1 is programmed.

Where second cell transistor CT2 is programmed, as a higher program voltage is applied, the amount of charge being captured by channel film 114 increases. Where each program voltage is applied, a threshold voltage of second cell transistor CT2 is increased by the amount proportional to the increment of each program voltage. For example, a relation between a threshold voltage of second cell transistor CT2 and the increment of the program voltage is represented by the following equation (2).

$$\Delta Vth2 = b \times \Delta V$$

In equation (2), ΔVth represents a change of a threshold voltage of second cell transistor CT2, ΔV represents an increment of the program voltage, and "b" is a proportional constant. The proportional constant "b" is inversely proportional to the amount of charge released through third sub insulating layer 119 where second cell transistor CT2 is programmed.

The proportional constant "b" is greater than the proportional constant "a". The proportional constants "a" and "b" represent changes of threshold voltages according to an increasing program voltage. That is, the magnitude of change of the threshold voltage of second cell transistor CT2 is greater than that of first cell transistor CT1. Even though the program voltage equally increases, the amount of changes (ΔVth1, ΔVth2) of threshold voltages of the first and second cell transistors CT1 and CT2 are different from each other. Consequently, each of cell transistors connected to other wordlines may have the different amount of changes of threshold voltage.

Figure 8:
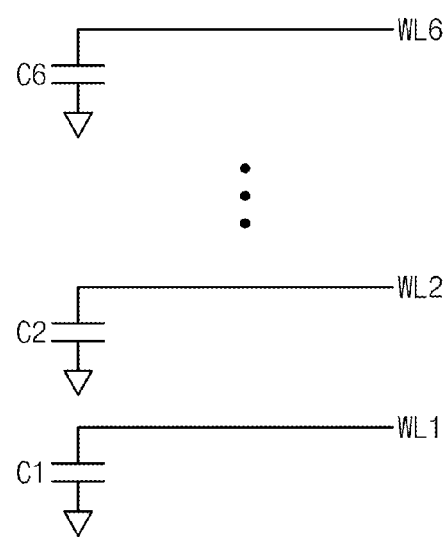
FIG. 8 is a diagram of wordlines in the memory block illustrated in FIG. 3.

FIG. 8 is a diagram of word lines WL1 through WL6. As illustrated in FIG. 8, each of the wordlines has an associated capacitance. These capacitances, labeled C1 through C6, may affect the programming and reading of memory cells connected to the corresponding wordlines.

Figure 9:
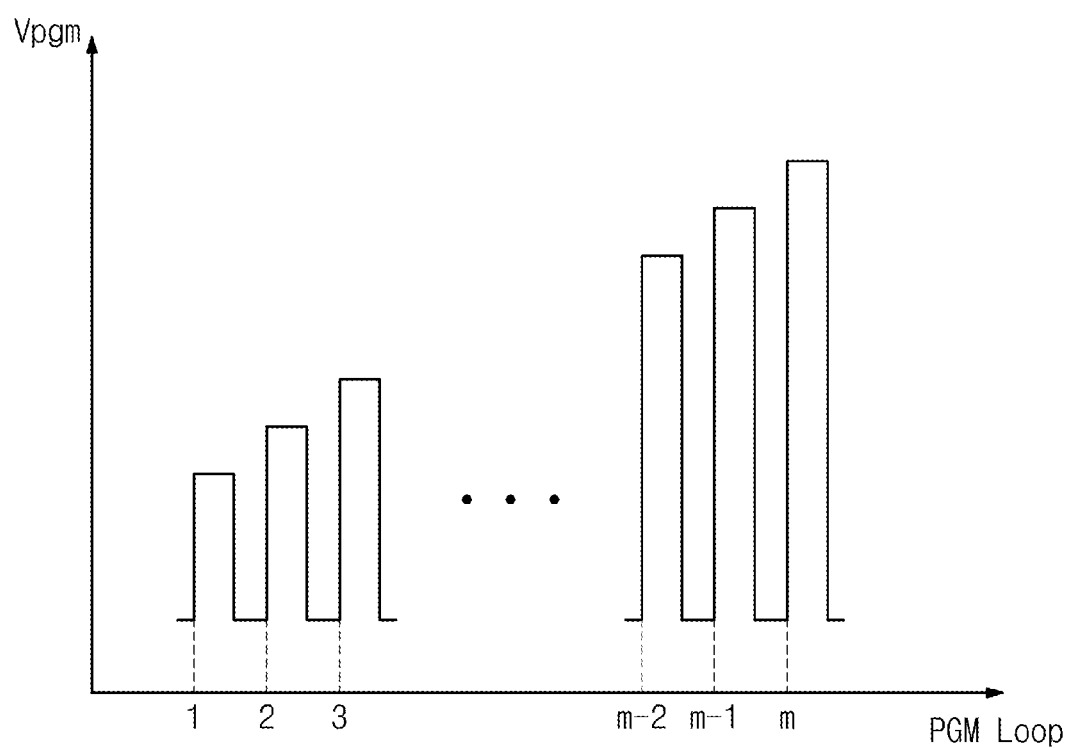
FIG. 9 is a graph showing program voltages applied to a selected wordline when a program operation is performed on the memory block of FIG. 3.

FIG. 9 is a graph showing program voltages applied to the selected wordline when a program operation is performed.

Referring to FIG. 9, a horizontal axis represents the number of program loops, and a vertical axis represents program voltages applied to the selected wordline. The number of program loops performed in a program operation may vary in different wordlines. In each program loop, nonvolatile memory 100 performs a sub program operation that applies a program voltage to the selected wordline, and a verification operation that checks whether threshold voltages of the programmed memory cells reach the required threshold voltage or not.

In each program loop, a program voltage applied to the selected wordline rises in stages. Memory cells connected to different wordlines may experience different changes of threshold voltages (referring to equations (1) and (2)). For example, changes of threshold voltages of memory cells connected to a wordline adjacent to the substrate may be greater than those of memory cells connected to a wordline far from the substrate. In a program operation of the wordline far from the substrate, more program loops may be performed compared with a program operation of the wordline adjacent to the substrate. Thus, the time taken for the program operation of the wordline far from the substrate is longer than the time taken for the program operation of the wordline adjacent to the substrate. That is, the time taken to perform a program operation may be different depending on which wordline is selected.

Figure 10:
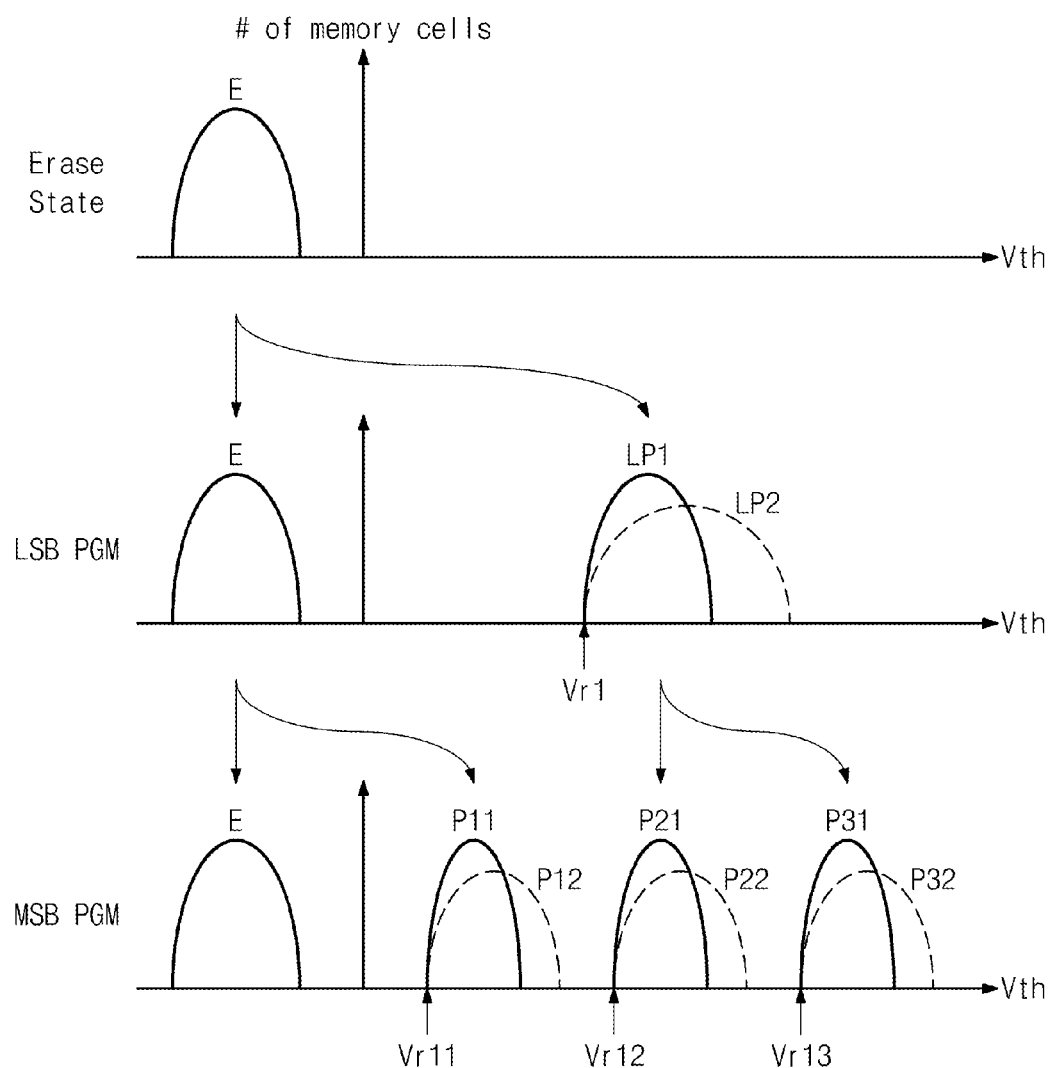
FIG. 10 is a diagram showing a distribution of threshold voltages when programming a least significant bit and a most significant bit.

FIG. 10 is a diagram showing a distribution of threshold voltages when programming the least significant bit and the most significant bit. In FIG. 10, a distribution of threshold voltages of the case that 2-bit data is stored in one memory cell is illustrated. However, the inventive concept is not limited to this example. Memory cells are configured to store at least one bit in one cell.

Assuming that the least significant bit (LSB) is programmed, sixth wordline WL6 is selected. Memory cells of sixth wordline WL6 may have two states. Memory cells having threshold voltages corresponding to an erasure state E may maintain erasure state E or may be programmed to a lower program state LP1. Until threshold voltages of memory cells being programmed are greater than verification voltage Vr1, program voltages being increased in stages are applied to sixth wordline WL6.

Assuming that the LSB is programmed, first wordline WL1 is selected. Memory cells of first wordline WL1 may have erasure state E or a second lower program state LP2. Until threshold voltages of memory cells being programmed are greater than verification voltage Vr1, program voltages being increased in stages are applied to first wordline WL1.

A distribution width of threshold voltage of first and second lower program states LP1 and LP2 may be different from each other. A part of the memory cells of second lower program state LP2 may have threshold voltages higher than the maximum voltage of first lower program state LP1. This is because the memory cell connected to sixth wordline WL6 has the amount of changes of threshold voltage greater than that of the memory cell connected to first wordline WL1. That memory cells have a different distribution width of threshold voltages at each wordline means that reliability stored in the memory cells is deteriorated.

After the LSB is programmed, the most significant bit (MSB) is programmed. It is assumed that sixth wordline WL6 is selected. Memory cells corresponding to an erasure state E of the LSB may maintain erasure state E or may be programmed to a first upper program state P11. Until threshold voltages of memory cells being programmed are greater than verification voltage Vr1, program voltages being increased in stages are applied to the selected wordline. Memory cells corresponding to first lower program state LP1 are programmed until their threshold voltages are higher than a verification voltage Vr12 to have a second upper program state P21 or until their threshold voltages are higher than a verification voltage Vr13 to have a third upper program state P31.

It is assumed that first wordline WL1 is selected. Memory cells corresponding to an erasure state E of the LSB maintain erasure state E or may be programmed until their threshold voltages are higher than a verification Vr11 to a first upper program state P12. Memory cells corresponding to second lower program state LP2 may be programmed to a second upper program state P22 or a third upper program state P32.

Distribution widths of threshold voltages of first upper program states P11 and P12 may be different from each other. First upper program state P12 may have a distribution width of threshold voltage wider than that of first upper program state P11. For example, a part of the memory cells of first upper program state P12 may have threshold voltages higher than the maximum voltage of first upper program state P11. Similarly, distribution widths of threshold voltages of second upper program states P21 and P22 may be different from each other. Distribution widths of threshold voltages of third upper program states P31 and P32 may be different from each other.

A read margin of the first, second and third upper program states P12, P22 and P32 may be relatively small. Memory cells may have different read margins from one another by wordlines. This means that reliability of data stored in the memory cells is deteriorated.

Figure 11:
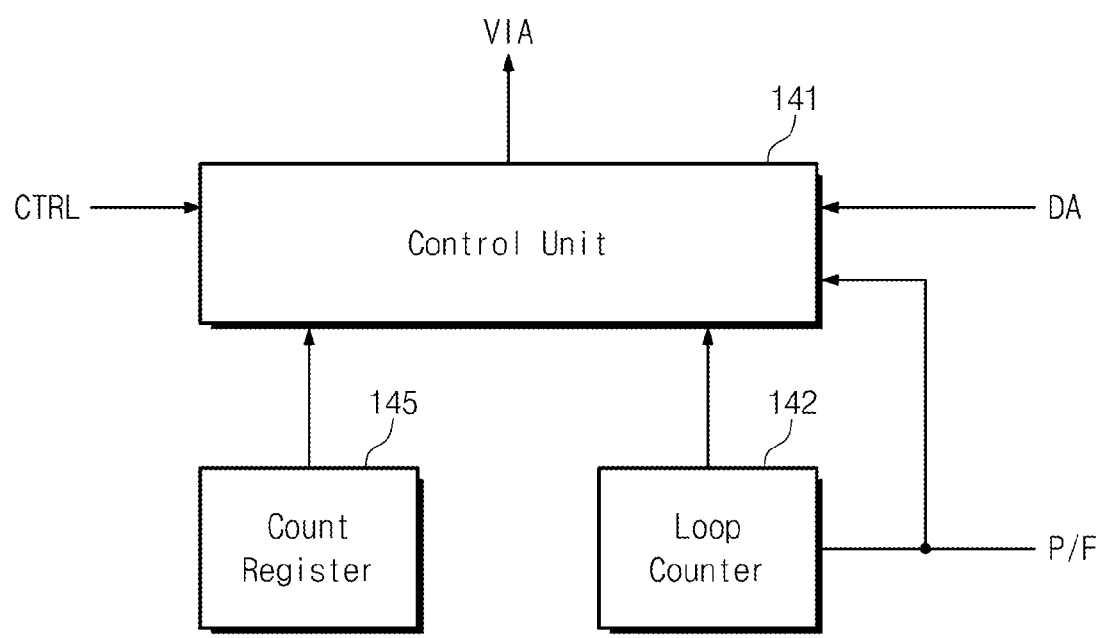
FIG. 11 is a diagram illustrating a more detailed example of control logic shown in FIG. 1.

FIG. 11 is a diagram illustrating an example of control logic 140 of FIG. 1 in further detail. Referring to FIGS. 1 and 10, control logic 140 comprises a control unit 141, a loop counter 142 and a count register 145.

Control unit 141 controls operations of control logic 140. Control unit 141 controls a program operation of nonvolatile memory 100 in response to a control signal CTRL received from input & output buffer 160. Control unit 141 controls sub program operations and verification operations performed when a program operation is performed. Control unit 141 sets the beginning voltage (a program voltage used when the first program loop is performed). Control unit 141 sets the beginning voltage using initial setting information obtained by a fuse cutting method or an electrical fuse (E-Fuse) method.

Control unit 141 is coupled to loop counter 142 and count register 145. Control unit 141 receives a pass/fail (P/F) signal from read & write circuit 150. When the P/F signal indicates a program fail, control unit 141 controls voltage generator 130 to generate a program voltage. Address decoder 120 applies the generated program voltage to the selected wordline.

The P/F signal is received by loop counter 142, and loop counter 142 increases the count value whenever the P/F signal indicates a program failure based on the initial count value.

Where the P/F signal indicates a program pass, control unit 141 receives a count value from loop counter 142. The received count value indicates the number of times that program voltages are applied, i.e., the number of program loops. Control unit 141 makes the selected wordline correspond to the number of times that program voltages are applied according to decoded row address DA. Control unit 141 stores the applied number of times in count register 145. The stored number of times corresponds to the selected wordline. Control unit 141 stores the applied number of times corresponding to each wordline in a table. Where a program operation is completed on each wordline, the applied number of times corresponding to each wordline is stored in count register 145.

The applied number of times and the wordline may correspond to each other in various methods. The applied number of times corresponding to each wordline of each memory block of memory cell array 110 may be stored. The applied number of times corresponding to wordline may be stored. In the case that first through sixth wordlines WL1~WL6 are provided, the six applied number of times corresponding to first through sixth wordlines WL1~WL6 respectively may be stored in count register 145.

Where control signal CTRL requesting a program operation is received, control unit 141 recognizes a wordline selected according to decoded row address DA and determines whether the applied number of times corresponding to the selected wordline is stored in count register 145. Where the applied number of times corresponding to the selected wordline is stored, control unit 141 generates voltage increasing information VIA on the basis of the applied number of times stored in count register 145.

Voltage increasing information VIA is received by voltage generator 130. Voltage generator 130 controls the increment of program voltages generated when a program operation is performed according to voltage increasing information VIA. As the applied number of times is large, the increment that voltage increasing information VIA indicates becomes great. As the applied number of times is small, the increment that voltage increasing information VIA indicates becomes small.

The increment of program voltages may be controlled so that the change of threshold voltages of the memory cells of first wordline WL1 ($\Delta$Vth of equation (1)) is equal to the change of threshold voltages of the memory cells of sixth wordline WL6 ($\Delta$Vth of equation (6)). Thus, a program operation with respect to first wordline WL1 may include the same program loops with a program operation with respect to sixth wordline WL6.

Control unit 141 determines whether to control the increment of program voltages according to the applied number of times stored in count register 145 and may selectively control the increment of program voltages.

Figure 12:
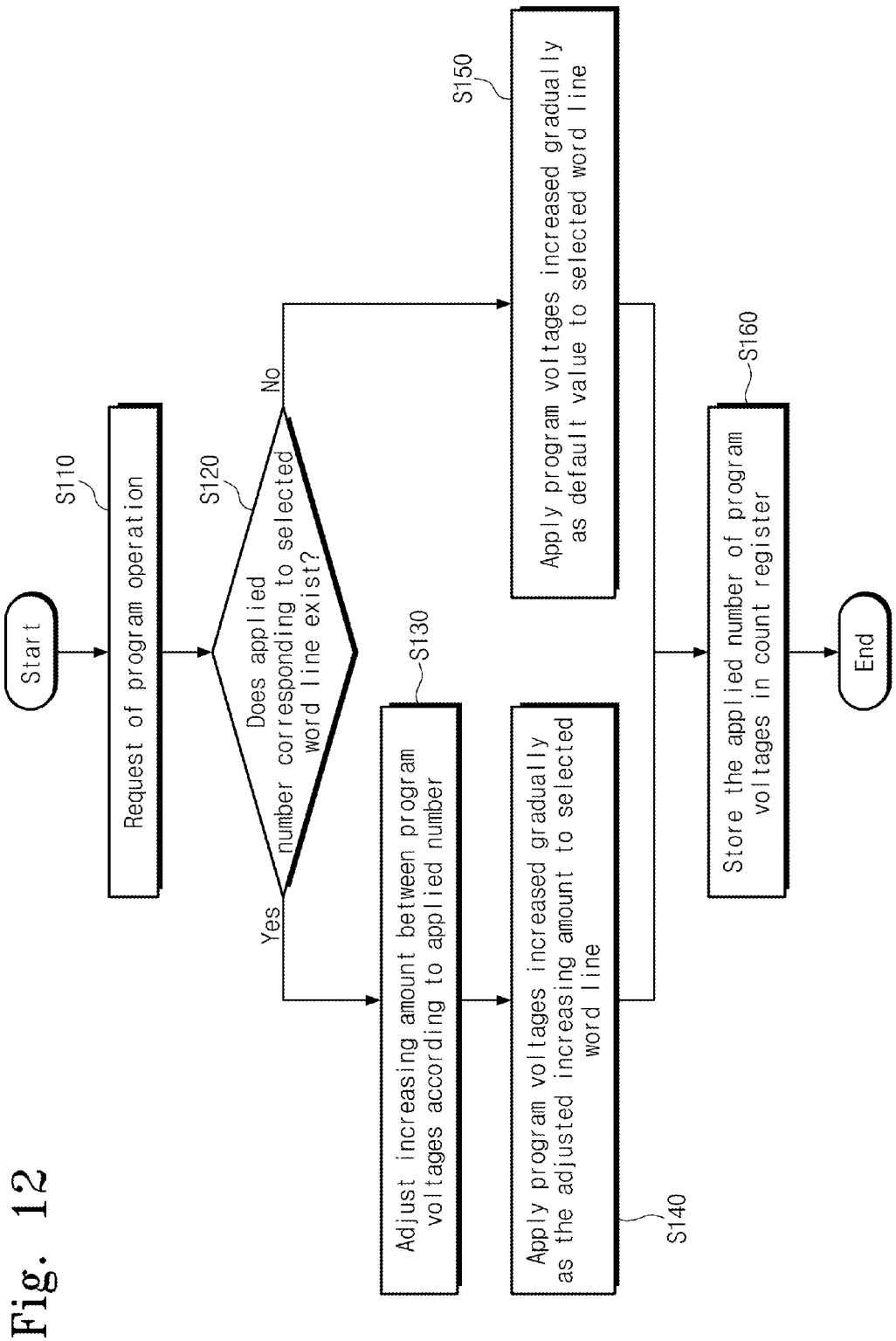
FIG. 12 is a flowchart illustrating a program method for a nonvolatile memory in accordance with an embodiment of the inventive concept.

FIG. 12 is a flowchart illustrating a program method for nonvolatile memory 100 in accordance with an embodiment of the inventive concept.

Referring to FIGS. 1 and 12, in operation S110, a control signal CTRL and an address ADDR requesting a program operation with respect to nonvolatile memory 100 are received. In operation S120, control logic 140 distinguishes whether the applied number of times corresponding to the selected wordline is stored in count register 145. Depending on the distinguished result, operation S130 or S150 is performed.

Where the applied number of times corresponding to the selected wordline is stored in count register 145, operation S130 may be performed. In operation S130, control logic 140 controls the increment of program voltages to be applied to the selected wordline according to the applied number of times. Control logic 140 sets voltage generator 130 so that the greater the applied number of times, the greater the increment of program voltages. Control logic 140 sets voltage generator 130 such that the lower the applied number of times, the lower the increment of program voltages. When the applied number of times is less than a specific value, the increment between program voltages may be controlled to a voltage lower than the default value. When the applied number of times is more than a specific value, the increment between program voltages may be controlled to a voltage higher than the default value.

In operation S140, program voltages being increased in stages by controlled increment are applied to the selected wordline, so that a program operation is performed. Voltage generator 130 generates the program voltages being increased in stages by controlled increment. Address decoder 120 applies program voltages generated at every program loop of the program operation to the selected wordline.

Where the applied number of times corresponding to the selected wordline is not stored in count register 145, operation S150 may be performed. In operation S150, program voltages being increased in stages by the default value are applied to the selected wordline. At this time, the default value means a specific value. For example, the default value means a value which is predetermined-set.

Before a program operation is performed (e.g., in a power up operation), control unit 141 sets the increment of program voltages generated in voltage generator 130 to the default value. For example, control unit 141 may set the increment of program voltages to the default value using initial setting information obtained according to a fuse cutting method or an electrical fuse method.

In operation S160, the applied number of program voltages is stored in count register 145. Control logic 140 counts the applied number of program voltages in response for the P/F signal from read & write circuit 150 to indicate a program fail. Control logic 140 stores the counted applied number in count register 145 in response for the P/F signal from read & write circuit 150 to indicate a program pass.

Figure 13:
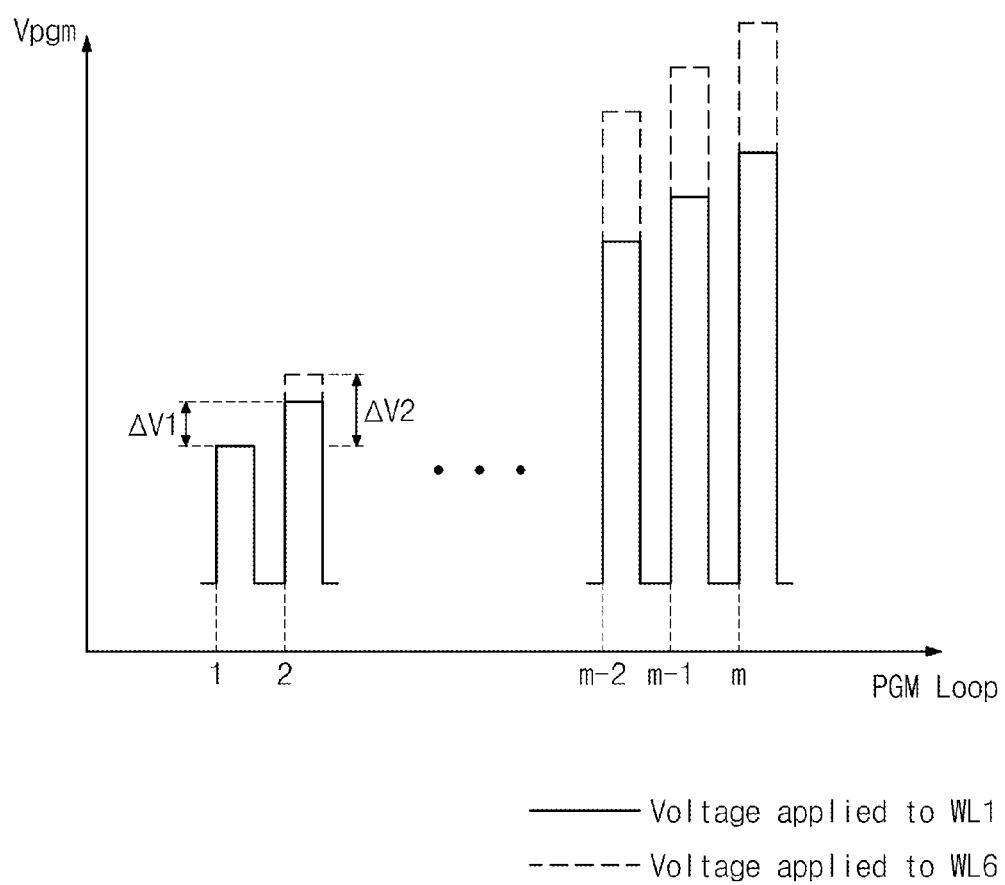
FIG. 13 is a graph showing program voltages applied to first and sixth wordlines when program operations are performed on the first and sixth wordlines.

FIG. 13 is a graph illustrating program voltages applied to first and sixth wordlines when program operations are performed on the first and sixth wordlines.

Referring to FIG. 13, a horizontal axis indicates the number of program loops and a vertical axis indicates program voltages applied to the selected wordline.

It is assumed that where program operations are performed on first and sixth wordlines WL1 and WL6, program voltages are being increased in stages by the default value. It is assumed that the applied number of program voltages when a program operation is performed on first wordline WL1 is greater than the applied number of program voltages when a program operation is performed on sixth wordline WL6. At this time, when the program operations are performed, the applied number of program voltages is stored in count register 145.

Where program operations are performed on first and sixth wordlines WL1 and WL6, control logic 140 controls the increment of program voltages according to the applied number of times stored in count register 145. Where a program operation is performed on first wordline WL1, program voltages being increased in stages by first increment $\Delta V1$ is applied to first wordline WL1. Where a program operation is performed on sixth wordline WL6, program voltages increased in stages by second increment $\Delta V2$ are applied to sixth wordline WL6. First increment $\Delta V1$ is smaller than the second increment $\Delta V2$. By controlling the increment of program voltages applied to first and sixth wordlines WL1 and WL6, memory cells being programmed may have desirable distribution of threshold voltages.

As illustrated in FIG. 10, memory cells of first and sixth wordlines WL1 and WL6 may have an erasure state and first lower program state LP1 after the program operations are performed. Memory cells of first and sixth wordlines WL1 and WL6 may have an erasure state and the first through third upper program states P11, P21 and P31 after the program operations are performed.

Figure 14:
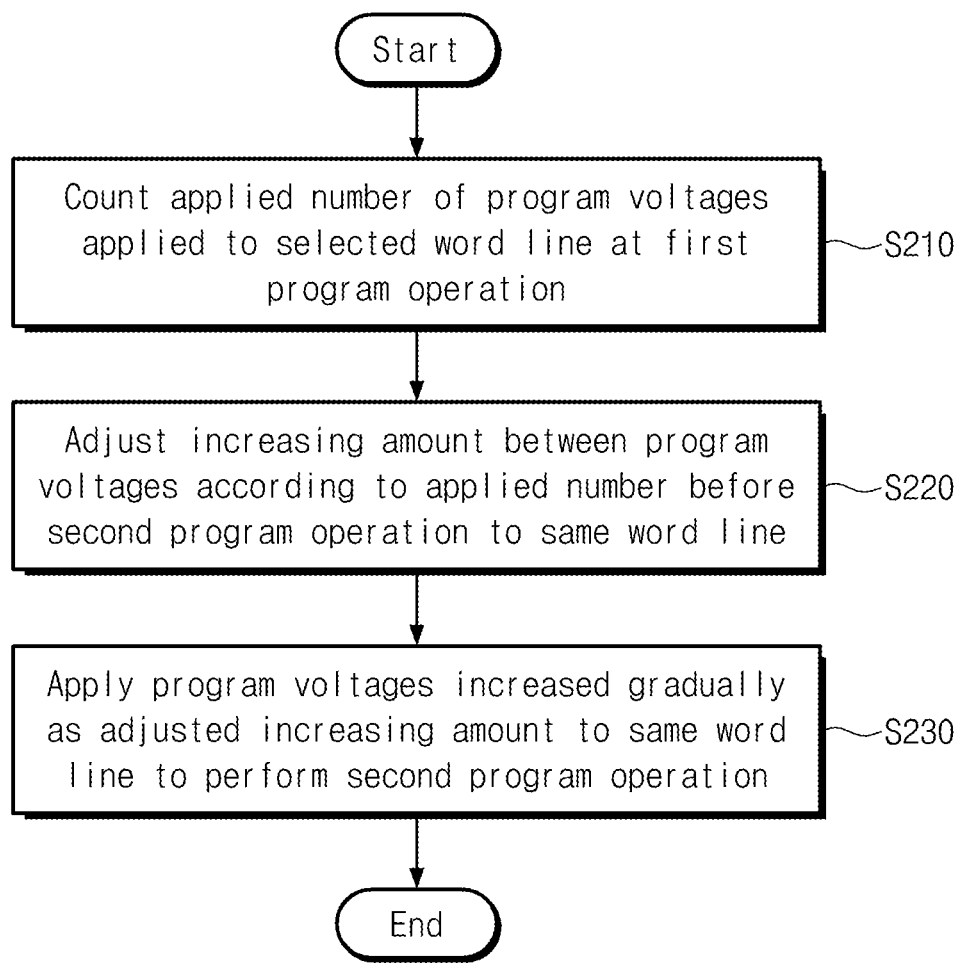
FIG. 14 is a flowchart illustrating a control method for a nonvolatile memory in accordance with an embodiment of the inventive concept.

FIG. 14 is a flowchart illustrating a method of controlling nonvolatile memory 100 in accordance with an embodiment of the inventive concept.

Referring to FIGS. 1 and 14, in operation S210, where a first program operation is performed, the applied number of program voltages of the selected wordline is counted, and the counted applied number of times is stored in count register 145. Because storage capacity of count register 145 is relatively small, the applied number of times stored in count register 145 may be stored in memory cell array 110. At this time, before operation S220 is performed, the applied number of times stored in memory cell array 110 is loaded in count register 145.

In operation S220, before a second program operation is performed on the same wordline, the increment of program voltages may be controlled according to the counted applied number of times. At this time, the second program operation is performed on the same wordline as the wordline selected when the first program operation is performed. An address ADDR may be received together with a control signal CTRL requesting the second program operation. If it is determined that the applied number of times corresponding to the wordline which address ADDR indicates is stored in count register 145, operation S220 is performed.

The greater the counted applied number of times is, the greater the increment of program voltages. The lower the counted applied number of times is, the smaller the increment of program voltages.

In operation S230, program voltages being increased in stages by the controlled increment are applied to the selected wordline, so that a second program operation is performed.

Figure 15:
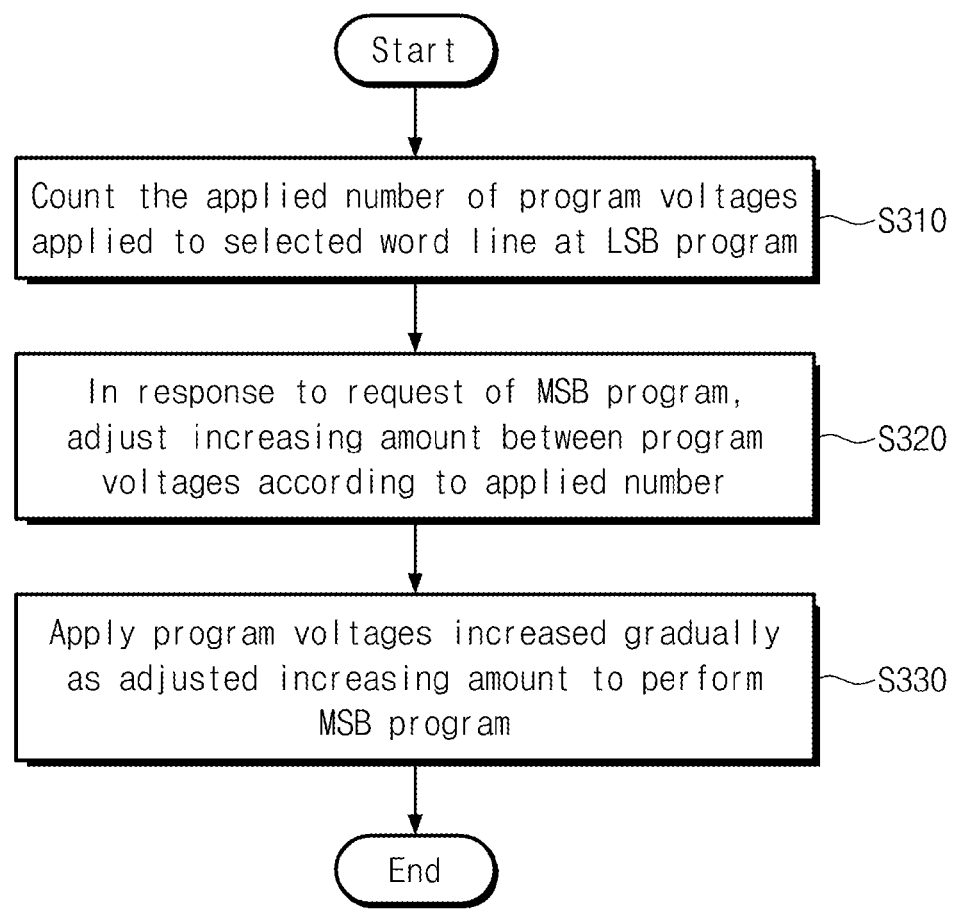
FIG. 15 is a flowchart illustrating an example of the control method of FIG. 14.

FIG. 15 is a flowchart illustrating an example of the method of FIG. 14. In description of FIG. 15, it is assumed that each of memory cells of memory cell array 110 stores two bits. However, the inventive concept is not limited to two bits. In general, the memory cells of memory cell array 110 may be configured to store two or more bits.

Referring to FIGS. 1 and 15, embodiments of FIG. 15 comprises operations S310, S320 and S330. Operations S310, S320 and S330 correspond to S210, S220 and S230 respectively.

In operation S310, the applied number of program voltages is counted which are applied the selected wordline when the least significant bit is programmed. In operation S320, in response to a program request of the most significant bit with respect to the same wordline, the increment of program voltages may be controlled according to the counted applied number of times. The increment of program voltages may be determined by the following equations (3) and (4).

$$CR = LN_{LSB}/TN$$

$$\Delta_{MSB} = \Delta V_{LSB} \times CR$$

Referring to equation (3), $LN_{LSB}$ represents the number of program loops performed when the least significant bit is programmed. That is, the $LN_{LSB}$ represents the applied number of program voltages when the least significant bit is programmed. TN represents the number of target program loops. CR represents a compensation ratio for controlling the increment of program voltages when the most significant bit is programmed. When dividing the number of program voltages when the least significant bit is programmed by the number of target program loops, compensation ratio CR is calculated.

Where the number of program voltages when the least significant bit is programmed is greater than the number of target program loops, the corresponding memory cells are programmed at low speed. The compensation ratio may be greater than 1. Where the number of program voltages when the least significant bit is programmed is smaller than the number of target program loops, the corresponding memory cells are programmed at high speed. The compensation ratio may be smaller than 1.

Referring to equation (4), $\Delta V_{LSB}$ represents the increment of program voltages used when the least significant bit is programmed. $\Delta V_{MSB}$ represents the increment of program voltages used when the most significant bit is programmed. $\Delta V_{MSB}$ may be calculated by multiplying $\Delta V_{LSB}$ by compensation ratio CR. As compensation ratio CR increases, the increment of program voltages used when the most significant bit is programmed increases accordingly. As compensation ratio CR is decreases, the increment of program voltages used when the most significant bit is programmed decreases as well.

According to FIGS. 3 and 4, where the applied number of program voltages for programming a least significant bit is relatively large, the increment of program voltages applied to the selected wordline when the most significant bit is programmed is increased. As the applied number of program voltages of when the least significant bit is programmed is relatively small, the increment of program voltages applied to the selected wordline when the most significant bit is programmed is reduced.

Referring back to FIG. 15, in operation S330, the program voltages being increased in stages by the controlled increment are applied to the selected wordline, so that the most significant bit program is performed.

In the embodiment of FIG. 15, according to the applied number of program voltages counted when the least significant bit is programmed, the increment of program voltages may be controlled before the most significant bit of memory cells of the same wordline is programmed. In other words, according to the applied number of program voltages counted when the least significant bit is programmed, the increment of program voltages may be controlled before the most significant bit of memory cells of the same wordline is programmed.

Figure 16:
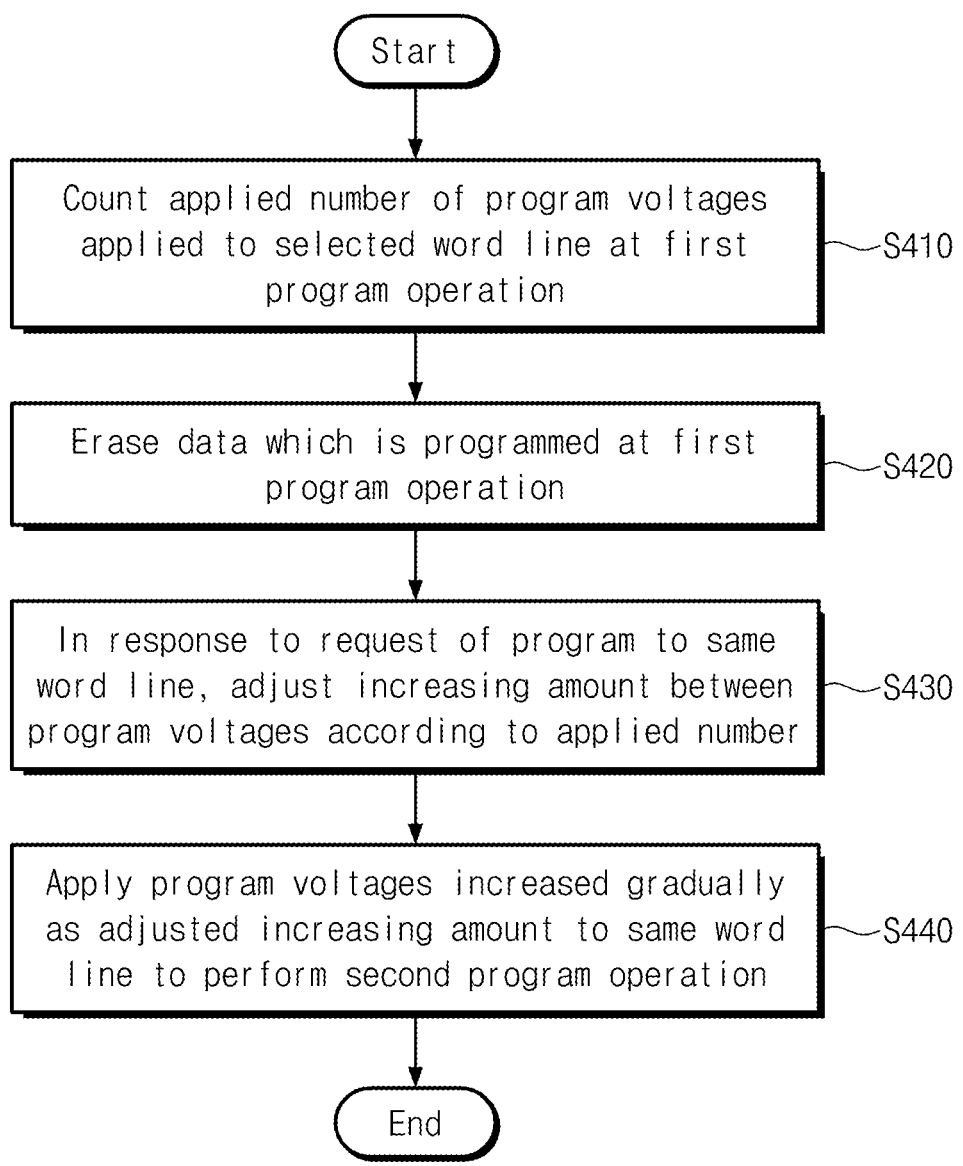
FIG. 16 is a flowchart illustrating another example of the control method of FIG. 14.

FIG. 16 is a flowchart illustrating another example of the control method of FIG. 14.

Referring to FIGS. 1 and 16, the method of FIG. 16 comprises operations S410 through S440. Operations S410, the S430 and the S440 correspond to operations S210, S220, and S230, respectively.

In operation S410, in a first program operation, the number of program voltages applied to the selected wordline is counted.

In operation S420, data programmed in first program operation is erased. Before receiving a second program operation request from the outside, nonvolatile memory 100 receives an erasure request of data programmed in the first program operation. Where each of memory cells of memory cell array 110 stores one bit, before the second program operation is performed, an erasure request of data stored by the first program operation may be required.

In operation S430, in response to a control signal requesting a program with respect to the same wordline, the increment of program voltages may be controlled according to the counted applied number of times. In operation S440, the program voltages being increased in stages by the controlled increment are applied to the selected wordline to perform the second program operation.

Figure 17:
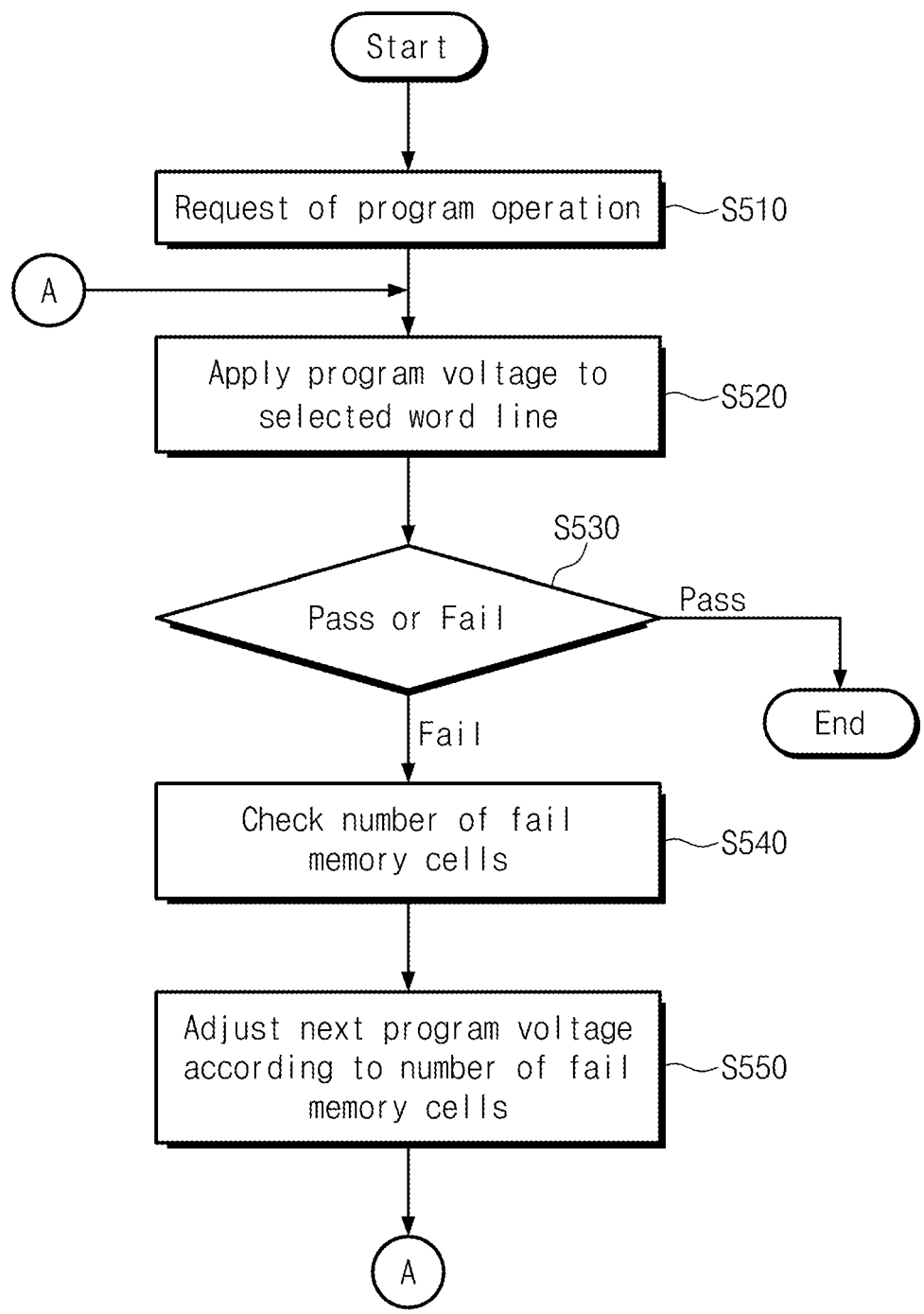
FIG. 17 is a flowchart illustrating a program method for a nonvolatile memory in accordance with an embodiment of the inventive concept.
Figure 18:
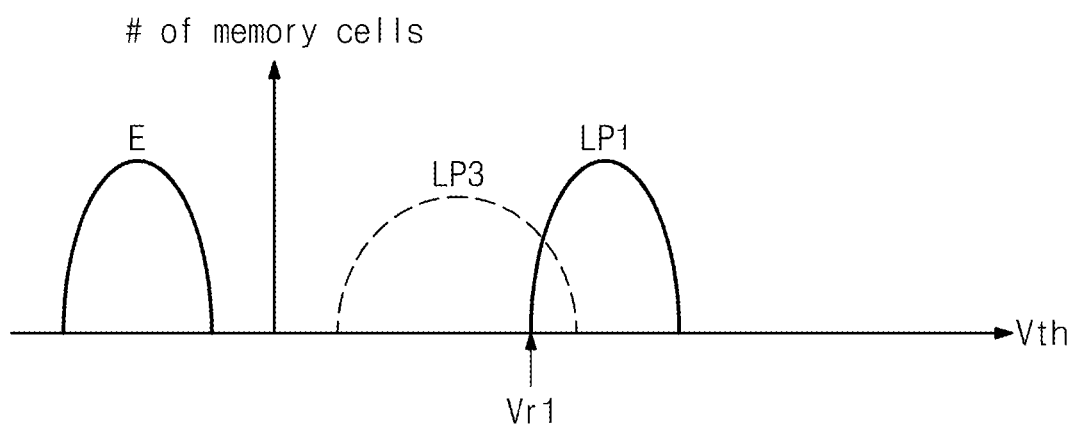
FIG. 18 is a diagram showing a distribution of threshold voltages of memory cells being programmed when programming a least significant bit.

FIG. 17 is a flowchart illustrating a program method of nonvolatile memory 100 in accordance with an embodiment of the inventive concept. FIG. 18 is a diagram showing a distribution of threshold voltages of memory cells being programmed when programming the least significant bit.

Referring to FIGS. 1 and 17, in operation S510, nonvolatile memory 100 receives a program operation request from the outside. In addition, nonvolatile memory 100 receives a control signal CTRL, an address ADDR and data DATA that request a program operation.

In operation S520, a program voltage is applied to the selected wordline. In operation S530, a verification operation is performed. If verification results are a program pass, a program operation is over. Where verification results are a program fail, operation S540 is performed. Operations S520 and S530 may be included in one program loop.

In operation S540, control logic 140 checks the number of memory cells that are program-failed. Read & write circuit 150 transmits information of the distinguished number to control logic 140.

Referring to FIG. 18, where a program voltage is applied to the wordline that is selected once, a threshold voltage distribution of memory cells connected to the selected wordline is illustrated.

If the program voltage is applied to the selected wordline, memory cells connected to the selected wordline may have an erasure state E or a third lower program state LP3. Memory cells having a threshold voltage lower than verification voltage Vr1 may exist. If read & write circuit 150 transmits a P/F signal indicating a program fail to control logic 140, control logic 140 may distinguish the number of memory cells that are program-failed according to the P/F signal. This may be performed where read & write circuit 150 distinguishes the number of memory cells having a threshold voltage lower than verification voltage Vr1 and transmits information of the distinguished number to control logic 140.

Referring again to FIG. 17, in operation S550, control logic 140 controls a next program voltage according to the number of program-failed memory cells. Control logic 140 controls a program voltage generated from voltage generator 130 when a next program loop is performed by transmitting information of the voltage increment to voltage generator 130.

In the embodiments of FIGS. 17 and 18, control logic 140 determines the number of program-failed memory cells whenever a program loop is performed and controls a program voltage generated from voltage generator 130 according to the determined number of program-failed memory cells. Accordingly, program voltages applied in a program operation are controlled and thereby the number of program loops performed when a program operation is performed. Also, programmed memory cells may have a desirable distribution of threshold voltage.

Figure 19:
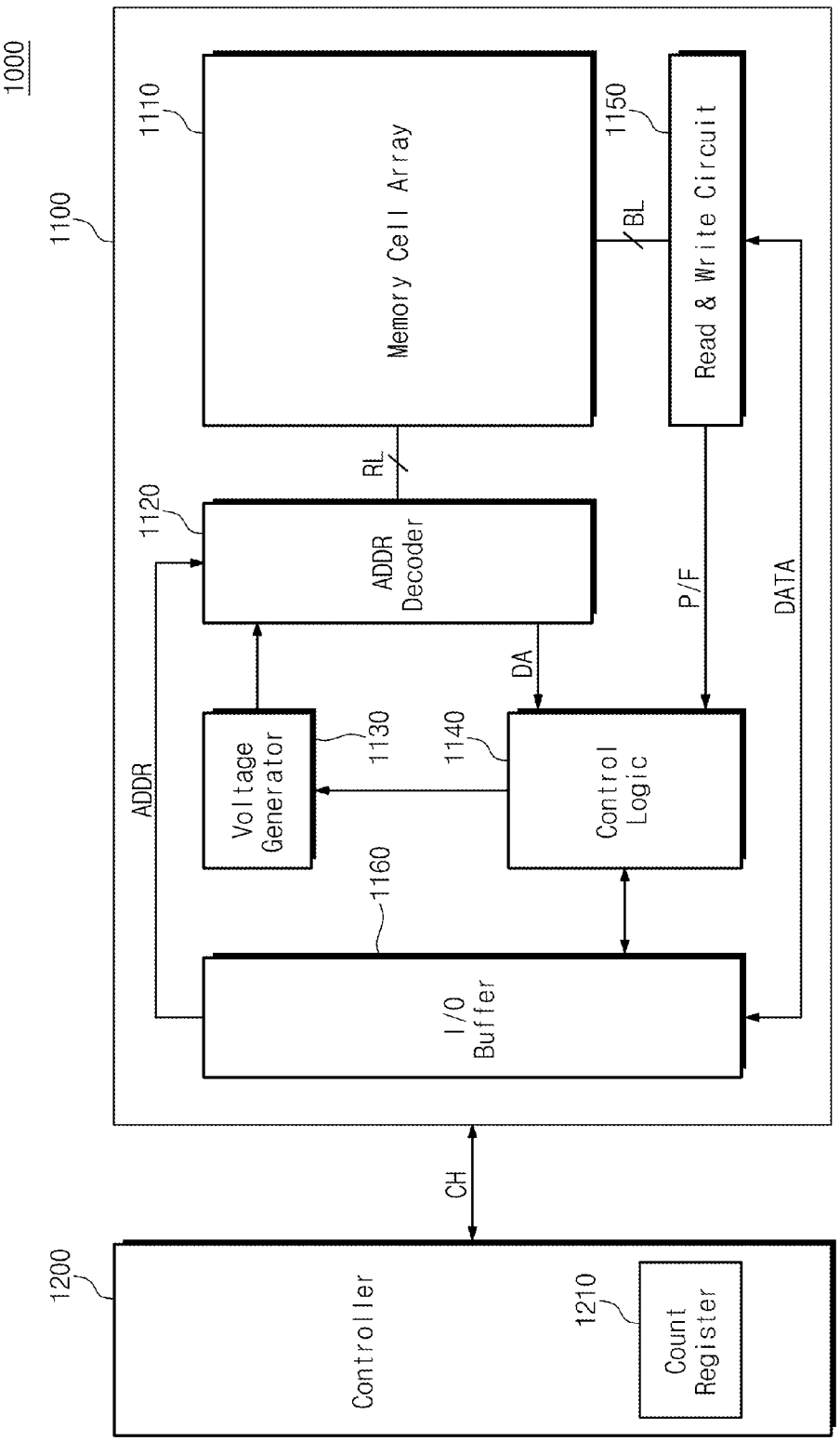
FIG. 19 is a block diagram of memory system in accordance with an embodiment of the inventive concept.

FIG. 19 is a block diagram of memory system 1000 in accordance with an embodiment of the inventive concept.

Referring to FIG. 19, memory system 1000 comprises a nonvolatile memory 1100 and a controller 1200. Nonvolatile memory 1100 comprises a memory cell array 1110, an address decoder 1120, a voltage generator 1130, a control logic 1140, a read & write circuit 1150 and an input/output buffer 1160. Memory cell array 1110, address decoder 1120, voltage generator 1130, control logic 1140, read & write circuit 1150 and input/output buffer 1160 are configured substantially the same as memory cell array 110, address decoder 120, voltage generator 130, control logic 140, read & write circuit 150 and input/output buffer 160 described with reference to FIG. 1.

Control logic 1140 controls the operation of nonvolatile memory 1000 under control of controller 1200. Where a control signal CTRL indicating a program operation is received, control logic 1140 controls nonvolatile memory 1000 to perform a program operation.

Control logic 1140 counts the number of program voltages applied to the selected wordline in the program operation. Control logic 1140 provides the counted number to controller 1200.

Controller 1200 is connected to an external host and nonvolatile memory 1000. In response to a request from the host, controller 1200 accesses nonvolatile memory 1000. Controller 1200 is configured to control read, write, erase and background operations of nonvolatile memory 1000. Controller 1200 provides an interface between nonvolatile memory 1000 and the host. For example, controller 1200 may receive a logical address from the host together with a program request. Controller 1200 converts the logical address into a physical address and transmits the converted physical address to nonvolatile memory 1100 as address ADDR.

Controller 1200 stores the applied number of times from control logic 1140 in a count register 1210. The stored applied number of times corresponds to the selected wordline. Controller 1200 stores the applied number of times corresponding to each wordline in a table.

If a program operation with respect to the wordline corresponding to the applied number of times stored in count register 1210 is requested, controller 1200 controls nonvolatile memory 1100 to adjust the increment between program voltages to be used when a program operation is performed according to the stored applied number of times.

Controller 1200 determines the increment between the program voltages according to the stored applied number of times and transmits voltage increment information to nonvolatile memory 1100 according to the determined increment. Control logic 1140 of nonvolatile memory 1100 sets a voltage generator to generate program voltages having the increment determined according to the voltage increment information.

Figure 20:
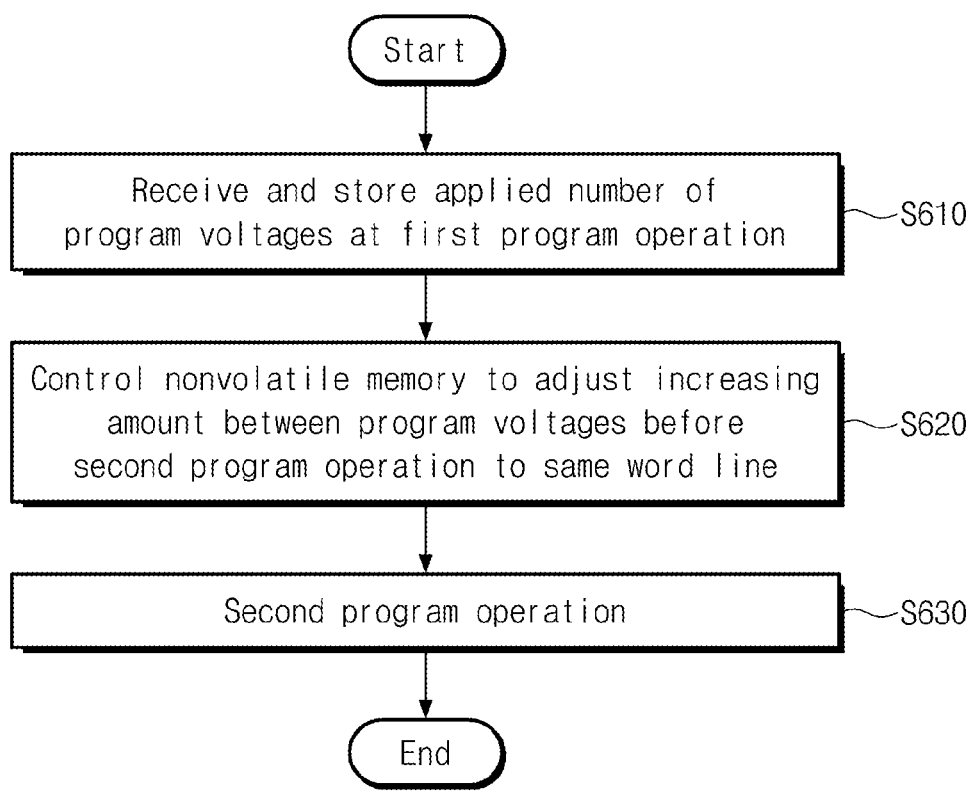
FIG. 20 is a flowchart illustrating a method of controlling a nonvolatile memory in the memory system of FIG. 19.

FIG. 20 is a flowchart illustrating a method performed by controller 1200 to control nonvolatile memory 1100.

Referring to FIGS. 19 and 20, in operation S610, the applied number of times of program voltages applied to the selected wordline when a first program operates is received from nonvolatile memory 1100 and the received applied number of times is stored. Nonvolatile memory 1100 counts the applied number of times (i.e., the number of program loops performed when the first program operates) when the first program operates. Nonvolatile memory 1100 transmits the counted applied number of times to controller 1200.

In operation S620, before a second program operation is performed on the same wordline, controller 1200 controls the increment of program voltages to be used where the second program operates in nonvolatile memory 1100 with reference to the counted applied number of times. Controller 1200 performs operation S630 according to whether or not the program operation requested from the host is a request of the program operation with respect to the wordline corresponding to the stored applied number of times.

In operation S630, the second program operation is performed. Controller 1200 transmits a control signal indicating a program operation, an address ADDR corresponding to the same wordline and data to be programmed to nonvolatile memory 1100 to perform the second program operation with respect to the same wordline. Nonvolatile memory 1100 programs data to be programmed on memory cells of wordline which address ADDR indicates.

In the embodiment of FIGS. 19 and 20, the increment of program voltages is controlled by controller 1200 and count register 1210 is included in controller 1200. However, the inventive concept is not limited to this configuration. The increment program voltages may be controlled by controller 1200 and a count register may be included in nonvolatile memory 1100 (e.g., a control logic). In this case, the count register of nonvolatile memory 1100 stores the number of times that program voltages are applied to the selected wordline when the first program operates. Operation S610 of FIG. 20 may be replaced by a step that controller 1200 requests and receives the applied number of times stored in the count register of nonvolatile memory 1100.

Controller 1200 further includes well known substituent elements such as a RAM, a processing unit, a host interface and a memory interface. The RAM may be used as at least one of an operation memory of processing unit, a cache memory between nonvolatile memory 1100 and the host, and a buffer memory between nonvolatile memory 1100 and the host. Also, the RAM performs a function of count register 1210. The processing unit controls the whole operation of controller 1200.

The host interface implements a protocol for performing data exchange between the host and controller 1200. Controller 1200 is typically configured to communicate with the host through at one or more of various interface protocols such as a universal serial bus (USB), multimedia card (MMC) protocol, a peripheral component interconnection (PCI) protocol, PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and integrated drive electronics (IDE) protocol, for example. The memory interface interfaces with nonvolatile memory 1100. The memory interface comprises a NAND interface or a NOR interface.

Memory system 1000 may further comprise an error correction block configured to detect an error of data read from nonvolatile memory 1100 and to correct the error using an error correction code (ECC). The error correction block can be provided as part of controller 1200. The error correction block may be provided as a part of nonvolatile memory 1100.

Controller 1200 and nonvolatile memory 1100 may be integrated into one semiconductor device. Controller 1200 and nonvolatile memory 1100 may be integrated into one semiconductor device to constitute a memory card. Controller 1200 and nonvolatile memory 1100 may be integrated into one semiconductor device to constitute a memory card such as a PC card, a compact flash card (CF), a smart media card (SM, SMC), a memory stick, a multimedia card (MMC, RS-MMC, MMCmicro), a SD card (SD, miniSD, microSD, SDHC), a universal flash memory device (UFS), etc.

Controller 1200 and nonvolatile memory 1100 may be integrated into one semiconductor device to form a solid state drive (SSD). In the case that memory system 1000 is used in the SSD, an operation speed of the host connected to memory system 1000 is greatly improved In certain embodiments, memory system 1000 may be included as part of an electronic device such as a computer, a UMPC (ultra mobile PC), a work station, a net book, a personal digital assistance (PDA), a portable computer, a web tablet, a wireless phone, a mobile phone, a smart phone, an e-book, a portable multimedia player (PMP), a portable game machine, a navigation device, a black box, a digital camera, a three-dimensional television, a digital audio recorder, a digital picture recorder, a digital picture player, a digital video recorder, a digital video player, a device that can transmit/receive information in a wireless environment, one of various electronic devices constituting a home network, one of various electronic devices constituting a computer network, one of various electronic devices constituting a telemetric network, one of various constituent elements constituting a RIFD device or a computing system, etc.

Nonvolatile memory 1100 and memory system 1000 can be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP) and wafer-level processed stack package (WSP).

Figure 21:
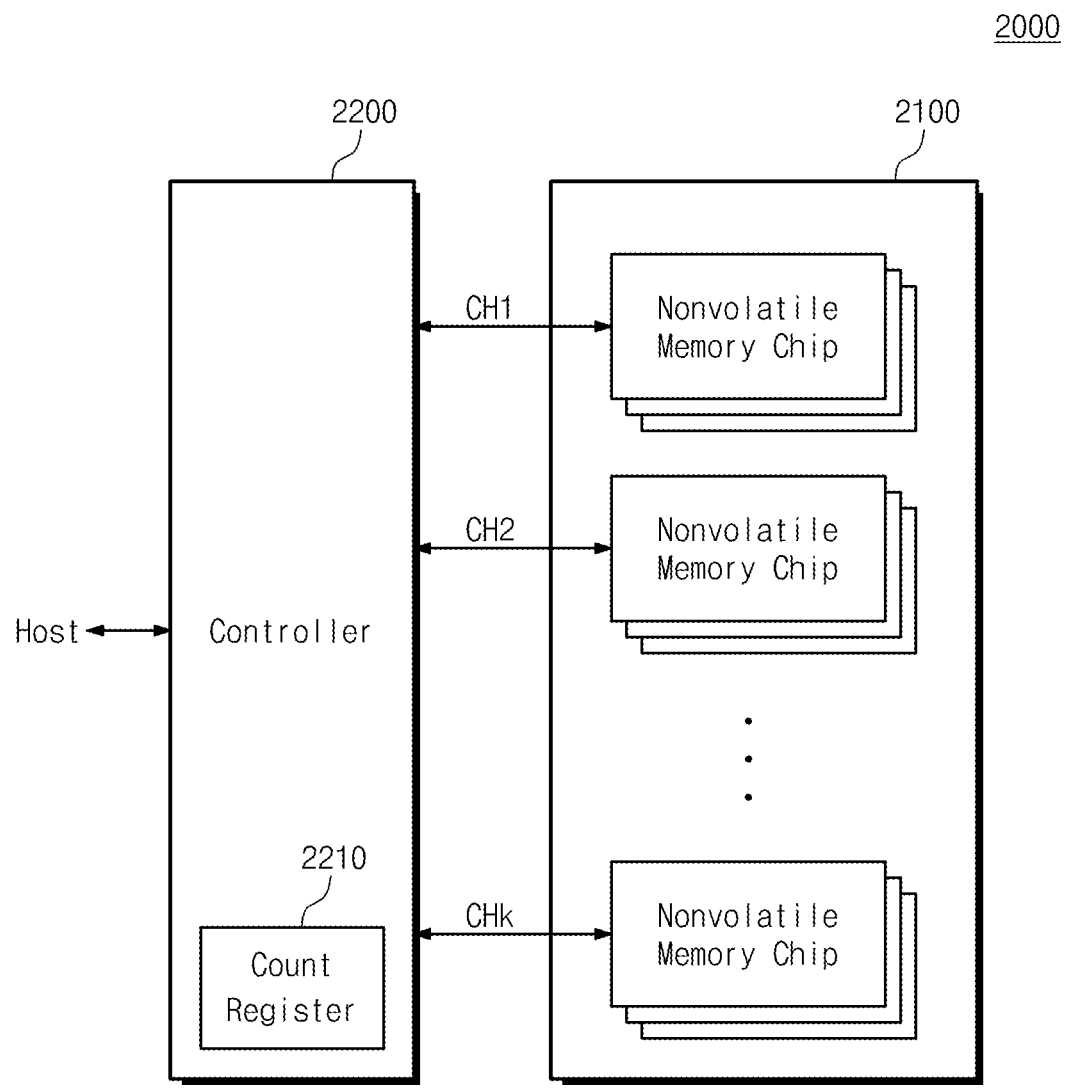
FIG. 21 is a block diagram of a system incorporating the memory system of FIG. 19.

FIG. 21 is a block diagram of a system 2000 incorporating memory system 1000 of FIG. 19.

Referring to FIG. 21, system 2000 comprises a nonvolatile memory 2100 and a controller 2200. Nonvolatile memory 2100 comprises a plurality of nonvolatile memory chips divided into a plurality of groups. Each group of the nonvolatile memory chips is configured to communicate with controller 2200 through one common channel. In FIG. 21, the nonvolatile memory chips is illustrated to communicate with controller 2200 first through kth channels (CH1~CHk). Each nonvolatile memory chip operates in common with nonvolatile memories 1100 described with reference to FIG. 19.

Controller 2200 comprises a count register 2210. Where a program operation is performed in each nonvolatile memory chip, the number of times that program voltages are applied is stored in count register 2210. Controller 2200 controls the increment between program voltages generated in each nonvolatile memory chip on the basis of the applied number of times stored in count register 2210.

Although FIG. 21 shows a plurality of nonvolatile memory chips connected to one channel, memory system 2000 may be modified so that one nonvolatile memory chip is connected to one channel.

In FIG. 21, controller 2200 comprises count register 2210. However, count register 2210 may be included in each of the nonvolatile memory chips (see, e.g., FIG. 1). In such embodiments, controller 2200 may omit include count register 2210.

Figure 22:
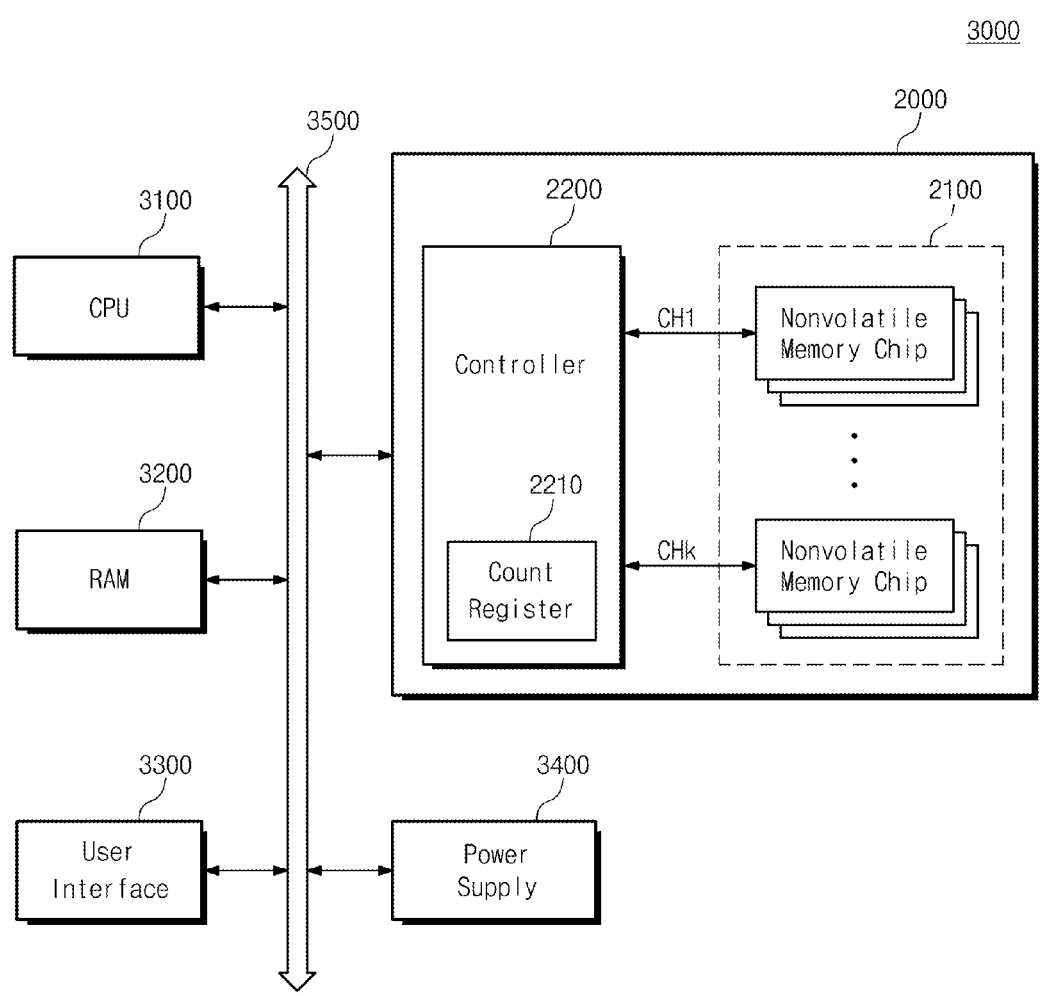
FIG. 22 is a block diagram of a computing system incorporating the system of FIG. 21.

FIG. 22 is a block diagram of a computing system 3000 including memory system 2000 described with reference to FIG. 21.

Referring to FIG. 22, computing system 3000 comprises a CPU 3100, a RAM 3200, a user interface 3300, a power supply 3400, and a memory system 2000.

Memory system 2000 is electrically coupled to CPU 3100, RAM 3200, user interface 3300 and power supply 3400 through a system bus 3500. Data provided through the user interface or processed by CPU 3100 is stored in memory system 2000.

In the example of FIG. 22, nonvolatile memory 2100 is coupled to system bus 3500 through a controller 2200. However, nonvolatile memory 2100 may be configured to be directly connected to system bus 3500. Functions of controller 2200 are performed by CPU 3100.

The embodiment of FIG. 22 incorporates memory system 2000 described with reference to FIG. 21. However, memory system 2000 may be replaced by memory system 1000 described with reference to FIG. 19, or computing system 3000 may include memory systems 1000 and 2000 described with reference to FIGS. 19 and 21.

As indicated by the foregoing, in some embodiments of the inventive concept, the applied number of times of program voltages applied when a program operation is performed is counted. The increment between program voltages to be applied to the selected wordline where a next program operation is performed is controlled according to the counted applied number of times. As the increment between program voltages is controlled, reliability of program operation performed in the nonvolatile memory may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory comprising memory cells stacked on a substrate, the method comprising:
    counting a number of program loops performed in a first program operation of selected memory cells connected to a selected wordline; and
    controlling an increment of a program voltage between successive program loops of a second program operation of the selected memory cells according to the counted number.

2. The method of claim 1, wherein the increment is controlled in response to a request to perform the second program operation on the selected memory cells.

3. The method of claim 1, wherein the first program operation programs low bit data in the selected memory cells, and the second program operation programs high bit data in the selected memory cells.

4. The method of claim 1, wherein the first program operation programs least significant bit data in the selected memory cells, and the second program operation programs most significant bit data in the selected memory cells.

5. The method of claim 1, further comprising erasing data from the selected memory cells after the first program operation is performed, and performing the second program operation thereafter.

6. The method of claim 5, wherein each of the memory cells connected to the selected wordline stores single bit data.

7. The method of claim 1, wherein the increment is controlled to be lower than a default value where the counted number is less than a predetermined value.

8. The method of claim 1, wherein the increment is controlled to be higher than a default value where the counted number is greater than a predetermined value.

9. The method of claim 1, further comprising counting a number of program loops in the second program operation.

10. The method of claim 1, further comprising storing the counted number in a table and accessing the table prior to the second program operation.

11. A nonvolatile memory, comprising:
a memory cell array comprising a plurality of memory cells stacked on a substrate, wherein the memory cell array is connected to a plurality of wordlines;
a voltage generator configured to generate a program voltage with an incremented value in successive program loops of program operations;
an address decoder configured to apply the generated program voltage to a selected wordline among the plurality of wordlines to program selected memory cells; and
control logic comprising a loop counter configured to count the number of program loops in a first program operation of the selected memory cells, and configured to control the increment between successive program loops of a second program operation performed on the selected memory cells according to the counted number of program loops.

12. The nonvolatile memory device of claim 11, further comprising a count register configured to store the counted number of program loops, wherein the control logic is configured to access the counted number of program loops from the count register.

13. The nonvolatile memory of claim 11, wherein the control logic is configured to control the increment in response to a request for the second program operation.

14. The nonvolatile memory of claim 11, wherein the number of program loops is stored in the count register in association with an indication of the selected wordline.

15. The nonvolatile memory of claim 14, wherein where the second program operation is performed, an address indicating the selected wordline is received and the control logic controls the increment between the program voltages according to whether the number of program loops stored in the count register corresponds to the received address.

16. The nonvolatile memory of claim 11, wherein the first program operation programs low bit data in the selected memory cells, and the second program operation programs high bit data in the selected memory cells.

17. The nonvolatile memory of claim 16, wherein the low bit data is least significant bit data and the high bit data is most significant bit data.

18. The nonvolatile memory of claim 11, wherein the second program operation is performed after data programmed in the first program operation is erased.

19. A method of operating a nonvolatile memory device comprising memory cells having a stacked configuration, comprising:
performing a first program operation on selected memory cells connected to a selected wordline by performing incremental step pulse programming with a plurality of program loops; and
performing a second program operation on the selected memory cells by performing incremental step pulse programming with a plurality of program loops and using an increment between successive program loops based on a number of program loops performed in the first program operation.

20. The method of claim 19, further comprising selecting the increment to be less than a default value where the number of program loops performed in the first program operation is less than a first predetermined value, and selecting the increment to be greater than the default value where the number of program loops performed in the first program operation is greater than a second predetermined value.

* * * * *